United States Patent
Shimojo et al.

(10) Patent No.: US 6,944,007 B2
(45) Date of Patent: Sep. 13, 2005

(54) CAPACITOR STRUCTURE

(75) Inventors: Yoshiro Shimojo, Yokohama (JP); Susumu Shuto, Yokohama (JP)

(73) Assignee: Kabushiki Kaisha Toshiba, Tokyo (JP)

(*) Notice: Subject to any disclaimer, the term of this patent is extended or adjusted under 35 U.S.C. 154(b) by 0 days.

(21) Appl. No.: 10/772,378

(22) Filed: Feb. 6, 2004

(65) Prior Publication Data
US 2005/0117273 A1 Jun. 2, 2005

(30) Foreign Application Priority Data
Dec. 1, 2003 (JP) .................... 2003-402087

(51) Int. Cl.⁷ .................................. H01G 4/005
(52) U.S. Cl. ............... 361/303; 301/305; 301/306.1; 301/306.3; 301/311; 301/313; 301/321.2; 257/295; 257/296; 438/240; 438/250
(58) Field of Search ............... 361/303, 305, 361/306.1, 306.3, 311, 313, 321.2, 301.4, 321.1, 328; 438/240, 250; 257/295, 296, 298

(56) References Cited

U.S. PATENT DOCUMENTS 6,388,281 B1 * 5/2002 Jung et al. ............. 257/295

6,682,944 B2 * 1/2004 Kikuchi et al. ............. 438/3

FOREIGN PATENT DOCUMENTS

JP  10-275897  10/1998
JP  2000-36568  2/2000

* cited by examiner

Primary Examiner—Anthony Dinkins
Assistant Examiner—Nguyen T. Ha
(74) Attorney, Agent, or Firm—Oblon, Spivak, McClelland, Maier & Neustadt, P.C.

(57) ABSTRACT

A capacitor is configured by a bottom electrode BE, an inter-electrode dielectric D, and a top electrode TE. Directly under the bottom electrode BE, for example, silicon oxide ($SiO_2$) is disposed, and directly above the top electrode TE as well, for example, silicon oxide ($SiO_2$) is disposed. The capacitor is covered with an insulating layer Low-k having a low dielectric constant. The insulating layer Low-k is formed from a material having as low of a dielectric constant as possible in order to reduce the parasitic capacitance between wirings. High-dielectrics High-k for suppressing the swelling of electric lines of force are disposed on side walls of an inter-electrode dielectric D. A dielectric constant of the High-dielectric High-k is at least higher than a dielectric constant of the insulating layer Low-k.

11 Claims, 15 Drawing Sheets

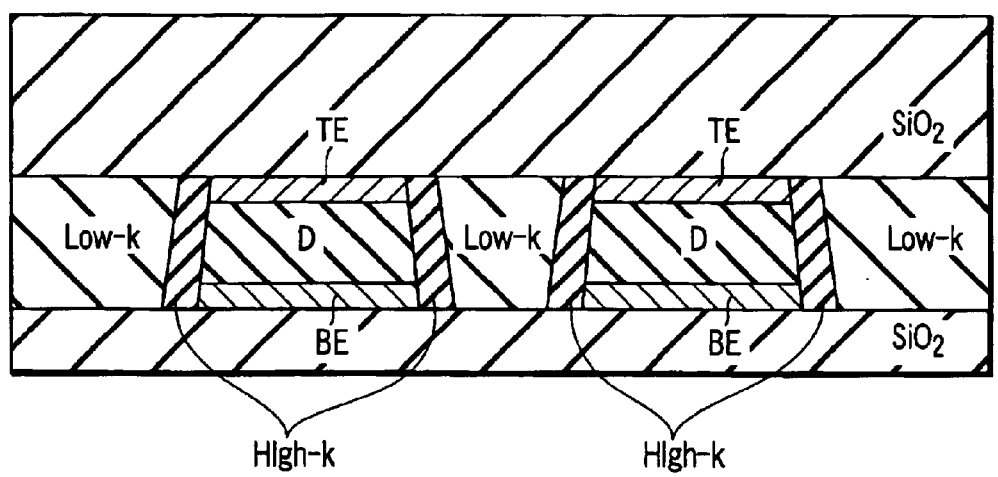
F I G. 5

CAPACITOR STRUCTURE

CROSS-REFERENCE TO RELATED APPLICATIONS

This application is based upon and claims the benefit of priority from the prior Japanese Patent Application No. 2003-402087, filed Dec. 1, 2003, the entire contents of which are incorporated herein by reference.

BACKGROUND OF THE INVENTION

1. Field of the Invention

The present invention relates to a capacitor structure, and in particular, is applied to a semiconductor memory using a capacitor as a data storage element.

2. Description of the Related Art

A capacitor used for a semiconductor integrated circuit has a structure, for example, as shown in FIG. 1. In recent years, in order to make the capacitance of a capacitor large, a case in which a high-dielectric is used as a dielectric (inter-electrode dielectric) disposed between capacitor electrodes, has increased.

Here, the high-dielectric means a dielectric having a dielectric constant higher than the dielectric constant $\kappa$=about 3.9 of silicon oxide ($SiO_2$).

For example, in dynamic random access memories (DRAMs), conventionally, a material whose dielectric constant $\kappa$ is up to about 10 ($SiO_2$, SiN, or the like) is used as an inter-electrode dielectric. However, in recent years, a material whose dielectric constant $\kappa$ is up to about 30 ($TaO_2$, $TiO_2$, $Al_2O_3$, $ZrO_2$, $HfO_2$, or the like) has come to be used, and moreover, a material whose dielectric constant $\kappa$ is up to about 500 (BST, PZT, SBT, or the like) has come to be used.

Further, with respect to a ferro-electric memory (Ferro-electric RAM: hereinafter FeRAM), currently, a case has come to increase in which a ferro-electric material whose dielectric constant $\kappa$ is from about 100 up to about 500, for example, PZT, SBT, or the like is used as an inter-electrode dielectric.

With respect to the ferro-electric memory, there is disclosed in, for example, Patent Document 1 (Jpn. Pat. Appln. KOKAI Publication No. 2000-36568) and Patent Document 2 (Jpn. Pat. Appln. KOKAI Publication No. 10-275897).

Here, electric lines of force generated between capacitor electrodes will be considered.

As shown in FIG. 1, at the central portion of the capacitor, the electric lines of force generated between the capacitor electrodes extend straightly from one electrode toward the other electrode. However, at the end portions of the capacitor, the electric lines of force trace a curve.

Here, as described above, currently, there is the trend that the dielectric constant $\kappa$ of an inter-electrode dielectric of a capacitor becomes higher. On the other hand, as an insulating layer surrounding the capacitor, generally, silicon oxide ($SiO_2$) is used.

In this case, for example, as shown in FIGS. 2 and 3, there are cases in which the electric lines of force greatly protrude from a space between the capacitor electrodes due to a difference between the dielectric constants of the inter-electrode dielectric (in the present example, PZT) and silicon oxide ($SiO_2$) disposed at the periphery of the inter-electrode dielectric.

Such swelling of the electric lines of force at the end portions of the capacitor will be not especially a problem when the areas of the capacitor electrodes are sufficiently large with respect to the distance between the capacitor electrodes. This is because, in such a case, because most of the electric lines of force cross through the space between the capacitor electrodes, the amount of the loss in electrostatic energy due to the swelling of the electric lines of force can be ignored.

However, as the miniaturization of the elements progresses, and as the areas of the capacitor electrodes become smaller, the amount of the loss in electrostatic energy due to the electric lines of force being swelled out of the space between the capacitor electrodes come to be not able to be ignored. Namely, the capacitance of the capacitor is made to be small by the amount of the loss, and a sufficient capacitance cannot be ensured.

For example, in semiconductor memories using a capacitor as a data storage element (DRAMs, FeRAMs, and the like), because the data is stored as an amount of electric charge stored in the capacitor, such a reduction in capacitance means that a margin between "1" data and "0" data is made to be small, and a deterioration in the S/N ratio of the data will be brought about.

Note that a conventional FeRAM structure is shown in FIG. 4 as an example of a semiconductor memory using a capacitor as a data storage element. It is important for improvement in the S/N ratio that, in such a FeRAM, the loss in electrostatic energy due to the swelling of the electric lines of force at the end portions of the cell capacitor is made to be as little as possible, and in accordance therewith, the capacitance of the cell capacitor is improved.

BRIEF SUMMARY OF THE INVENTION

A semiconductor device according to an aspect of the present invention comprises: a capacitor configured by a bottom electrode, a top electrode, and a dielectric disposed between the bottom electrode and the top electrode; an insulating layer which surrounds the capacitor; and a high-dielectric which is disposed between the dielectric and the insulating layer, and which entirely covers side wall portions of the dielectric, wherein a dielectric constant of the high-dielectric is higher than a dielectric constant of the insulating layer.

A manufacturing method for a semiconductor device according to an aspect of the present invention comprises: forming a first conductive material; forming a dielectric on the first conductive material; forming a second conductive material on the dielectric; forming a top electrode formed from the second conductive material by etching on the second conductive material and the dielectric; forming a high-dielectric which entirely covers side surfaces of the dielectric; forming a bottom electrode formed from the first conductive material by etching on the high-dielectric and the first conductive material; and forming an insulating layer which covers the bottom electrode, the top electrode, and the high-dielectric, wherein a dielectric constant of the high-dielectric is higher than a dielectric constant of the insulating layer.

BRIEF DESCRIPTION OF THE SEVERAL VIEWS OF THE DRAWING

FIG. 5 is a diagram showing a capacitor structure according to an example of the present invention;

DETAILED DESCRIPTION OF THE INVENTION

A semiconductor device of an aspect of the present invention will be described below in detail with reference to the accompanying drawings.

1. Example of Capacitor Structure

FIG. 5 shows a capacitor structure according to an example of the present invention.

The capacitor is configured by a bottom electrode BE, a top electrode TE, and a dielectric D disposed between the electrodes.

The dielectric D is formed from, for example, $SiO_2$, SiN, $TaO_2$, $TiO_2$, $Al_2O_3$, $ZrO_2$, $HfO_2$, BST, PZT, SBT, or the like.

The capacitor is surrounded by an insulating layers Low-k. Here, the insulating layer Low-k means an insulating layer (including an air layer) having a dielectric constant which is equal to or lower than the dielectric constant $\kappa$=about 3.9 of silicon oxide ($SiO_2$). The insulating layer Low-k is formed from, for example, silicon oxide.

Insulating layers High-k are disposed between the dielectrics D and the insulating layers Low-k. The insulating layers High-k entirely cover side wall portions of the dielectrics D. Here, the insulating layer High-k means an insulating layer having a dielectric constant higher than the dielectric constant $\kappa$=about 3.9 of silicon oxide ($SiO_2$), i.e., a high-dielectric.

The insulating layer High-k is formed from, for example, SiN, $TaO_2$, $TiO_2$, $Al_2O_3$, $ZrO_2$, $HfO_2$, BST, PZT, SBT, or the like.

There is the trend that insulating layer Low-k is formed from a material having as low of a dielectric constant as possible, in order to reduce the parasitic capacitance wires. Therefore, in the example of the present invention, at least the side wall portions of the dielectrics D are covered with the insulating layers High-k.

Provided that the capacitor is configured in this way, as compared with a case in which the dielectrics D directly contact the insulating layers Low-k, the swelling of electric lines of force at the end portions of the capacitor can be made to be small. Namely, in accordance with the example of the invention, the loss in electrostatic energy at the end portions of the capacitor can be made to be small, and in accordance therewith, the capacitance of the capacitor can be markedly improved.

Figure 1:
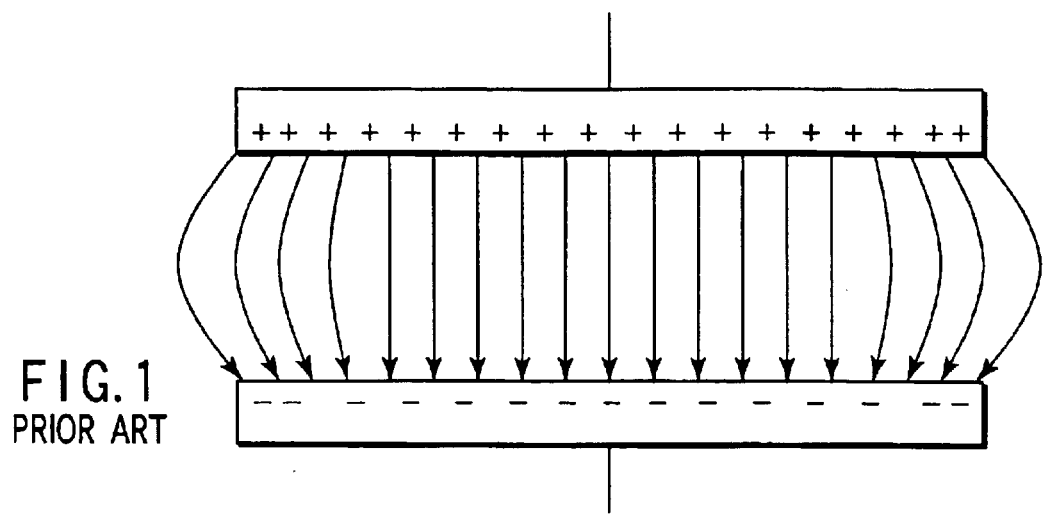
FIG. 1 is a diagram showing electric lines of force generated at a capacitor.
Figure 2:
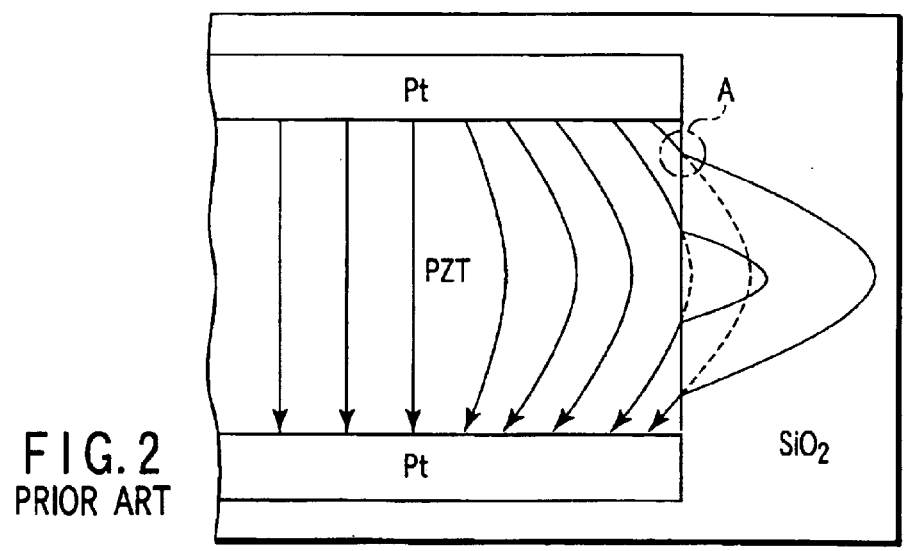
FIG. 2 is a diagram showing the electric lines of force generated at the capacitor.
Figure 3:
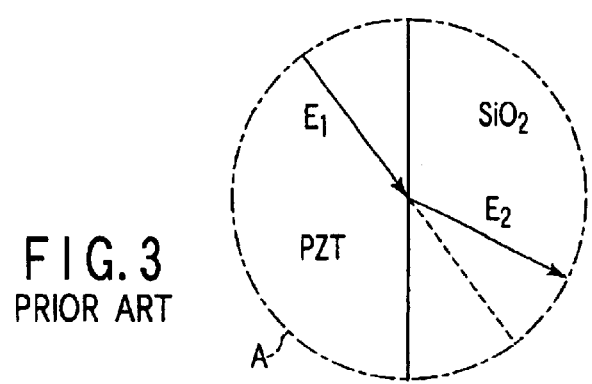
FIG. 3 is a diagram showing a state of refraction of the electric lines of force.
Figure 4:
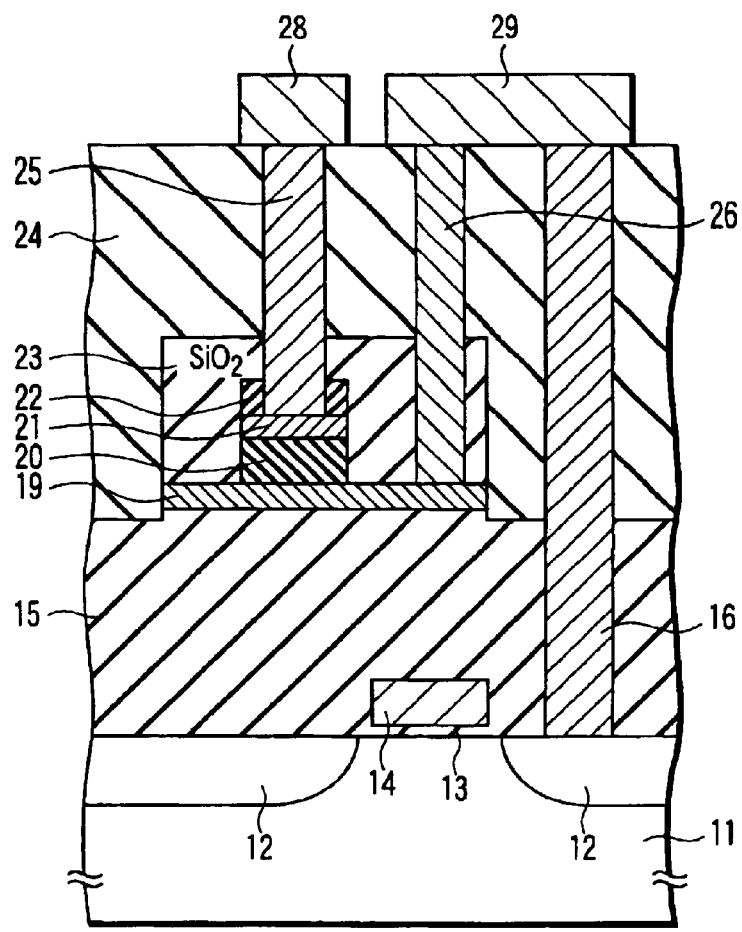
FIG. 4 is a diagram showing a conventional FeRAM memory cell.
Figure 6:
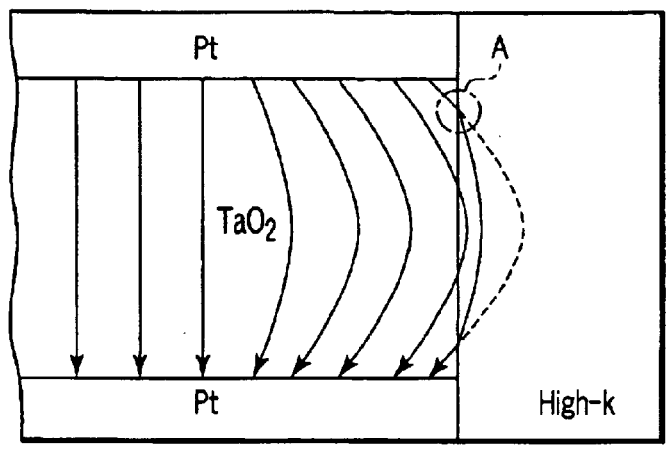
FIG. 6 is a diagram showing electric lines of force generated at a capacitor.
Figure 7:
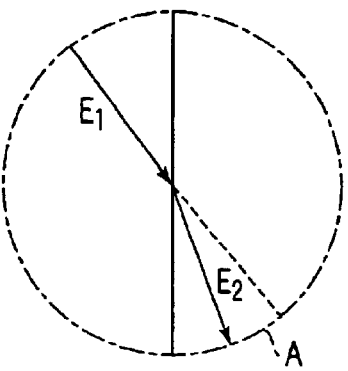
FIG. 7 is a diagram showing a state of refraction of the electric lines of force.

Note that, provided that the dielectric constant of the insulating layer High-k is made higher than that of the dielectric D, as shown in FIGS. 6 and 7, because the most part of the electric lines of force can be put within a space between the capacitor electrodes due to a difference between the both dielectric constants, the loss in electrostatic energy at the end portions of the capacitor can be made to be even smaller.

In the capacitor structure of FIG. 5, due to the side surfaces of the capacitor being made to incline, the entire body is made to be a trapezoidal shape. However, the example of the invention is not limited such a shape, and can be applied to various shapes of capacitors.

2. Embodiments

Hereinafter, embodiments in a case in which a capacitor according to the example of the present invention is applied to an FeRAM memory cell, will be described.

(1) First Embodiment

Figure 8:
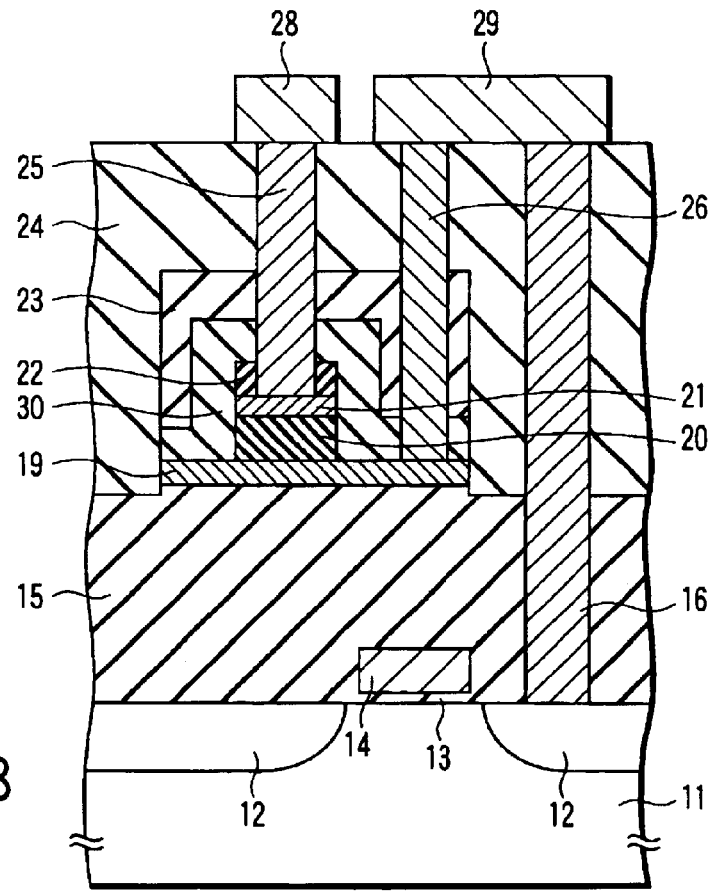
FIG. 8 a diagram showing an FeRAM memory cell according to a first embodiment of the present invention.

[A] Structure FIG. 8 shows an FeRAM memory cell according to a first embodiment of the present invention.

This memory cell has an offset type cell structure in which contact with respect to a bottom electrode of a cell capacitor is made from the top portion of the cell capacitor.

A cell transistor is formed on a silicon substrate 11. The cell transistor has source/drain regions 12, a gate insulating layer 13, and a gate electrode 14. The cell transistor is covered with an insulating layer (for example, silicon oxide) 15.

Figure 9:
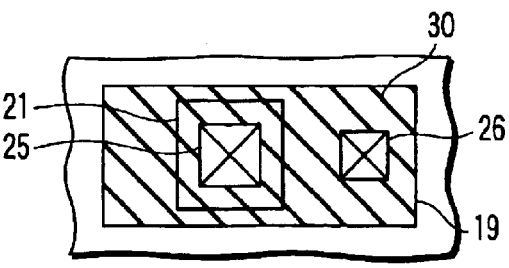
FIG. 9 is a diagram showing a planar layout of a cell capacitor.

A bottom electrode (for example, Pt) 19 of the cell capacitor is formed on the insulating layer 15. For example, as shown in FIG. 9, the bottom electrode 19 has a quadrangle in a case of being looked from the top thereof. Here, the edge portions of the quadrangle may be rounded.

A ferro-electric (for example, PZT, SBT, or the like) 20 is formed on the bottom electrode 19. A top electrode (for example, Pt) 21 is formed on the ferro-electric 20.

For example, as shown in FIG. 9, the top electrode 21 has a quadrangle in a case of being looked from the top thereof. Here, the edge portions of the quadrangle may be rounded. The top electrode 21 is smaller than the bottom electrode 19.

An insulating layer (for example, silicon oxide) 22 functioning as a mask when the ferro-electric 20 and the top electrode 21 are patterned, is formed on the top electrode 21.

Here, in the example of the present invention, a high-dielectric (for example, SiN, $TaO_2$, $TiO_2$, $Al_2O_3$, $ZrO_2$, $HfO_2$, BST, PZT, SBT, or the like) 30 is formed so as to entirely cover side wall portions of the ferro-electric 20 disposed between the bottom electrode 19 and the top electrode 21.

The high-dielectric 30 is formed from a material having a dielectric constant higher than the dielectric constants of insulating layers (for example, silicon oxides) 23 and 24 which surround the high-dielectric 30 and will be described later.

In the present embodiment, for example, as shown in FIG. 9, the high-dielectric 30 entirely covers the ferro-electric 20 and the top electrode 21.

It is good that the thickness of the high-dielectric 30 is formed to be as thick as the thickness of the ferro-electric 20. Here, the thickness of the high-dielectric 30 means the thickness in the direction parallel to the surface of the silicon substrate 11 at the side wall portions of the ferro-electric 20 and the top electrode 21.

An insulating layer (for example, silicon oxide) 23 is formed on the high-dielectric 30. The insulating layer 23 functions as a mask when the bottom electrode 19 and the high-dielectric 30 are patterned.

An insulating layer (for example, silicon oxide) 24 is formed on the insulating layer 23. A contact hole reaching the top electrode 21 is formed at the insulating layers 22, 23, and 24, and the high-dielectric 30. A contact plug 25 is formed in this contact hole. A wiring 28 is formed on the contact plug 25.

Further, a contact hole reaching the bottom electrode 19 is formed at the insulating layers 23 and 24, and the high-dielectric 30. A contact plug 26 is formed in this contact hole. In the same way, a contact hole reaching the source/drain region 12 is formed at the insulating layers 15 and 24. A contact plug 16 is formed in this contact hole. A wiring 29 is formed on the contact plugs 16 and 26.

In accordance with such a structure, the end portions of the cell capacitor configuring the FeRAM memory cell are covered with the high-dielectric having a dielectric constant higher than a dielectric constant of an interlayer insulating layer formed from silicon oxide ($SiO_2$) or the like.

Figure 10:
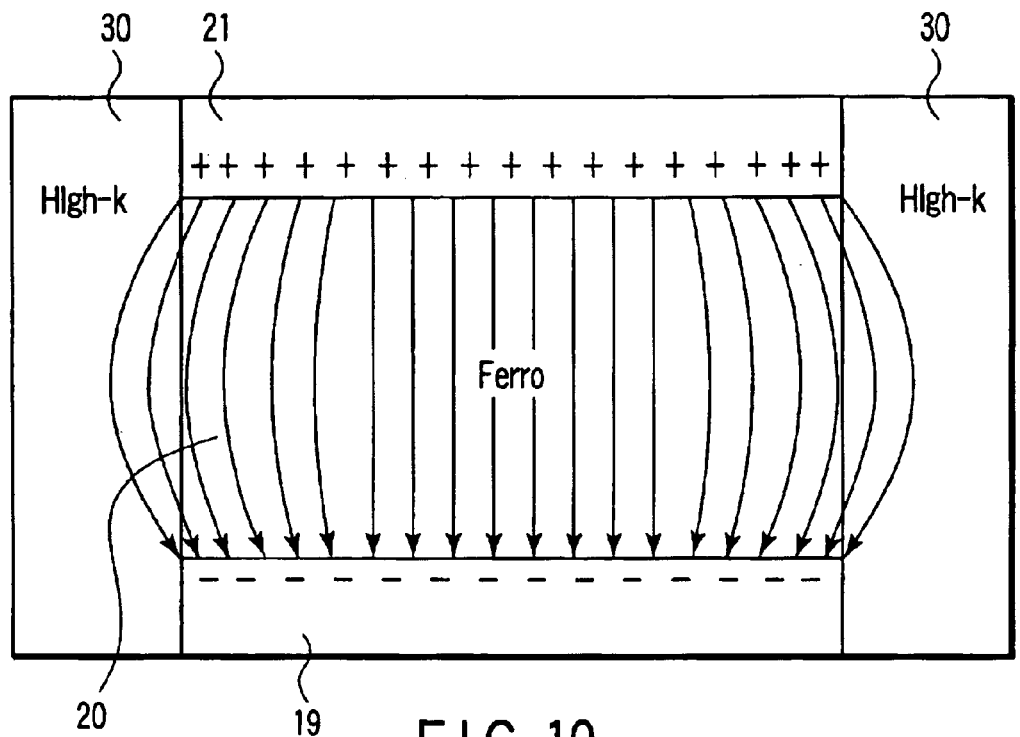
FIG. 10 is a diagram showing electric lines of force generated at a capacitor.
Figure 11:
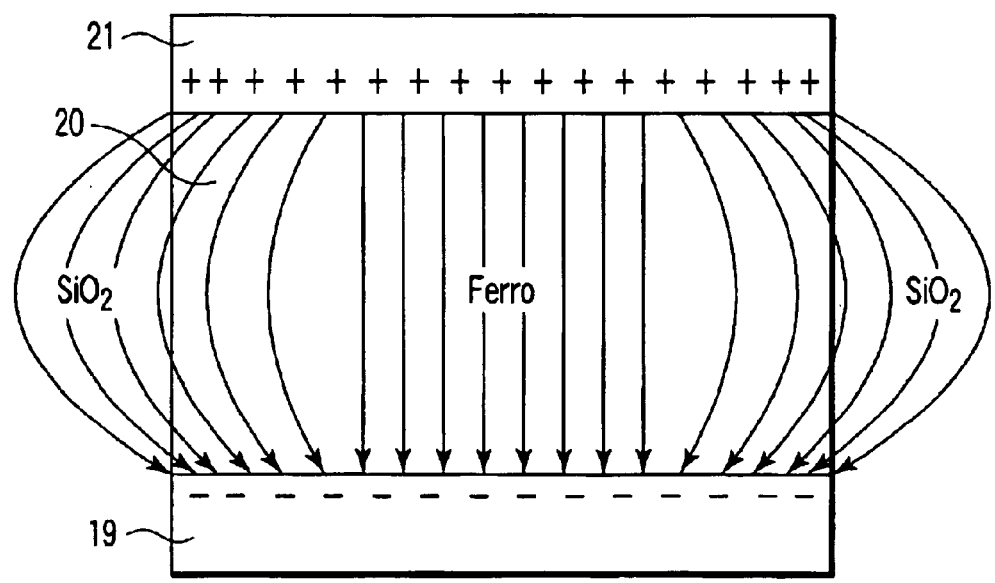
FIG. 11 is a diagram showing the electric lines of force generated at the capacitor.

In this case, for example, as shown in FIGS. 10 and 11, the spreading, in the transverse direction, of the electric lines of force (FIG. 10) at the end portions of the cell capacitor according to the example of the invention is less than the spreading, in the transverse direction, of the electric lines of force (FIG. 11) at the end portions of a conventional cell capacitor.

Accordingly, in accordance with the example of the invention, the electric field relaxation at the end portions of the cell capacitor can be eliminated, and the ferro-electric 20 can be efficiently polarized at the end portions of the cell capacitor.

As described above, in accordance with the example of the invention, the loss in electrostatic energy due to the swelling of the electric lines of force can be made to be as small as possible, and in accordance therewith, the capacitance of the capacitor can be improved, and therefore, the S/N ratio of a semiconductor memory using the capacitor as a data storage element can be improved.

Note that, in the embodiment, the side surfaces of the cell capacitor are perpendicular, or substantially perpendicular, to the surface of the silicon substrate 11. However, for example, as the capacitor of FIG. 5, the side surfaces of the capacitor may be made a tapered shape.

The present embodiment is described by using the case of an FeRAM. However, the present embodiment can be easily applied to other semiconductor memories using a capacitor as a memory cell, for example, DRAMs. In this case, the dielectric configuring the cell capacitor may be replaced from a "ferro-electric" to a "high-dielectric".

[B] Manufacturing Method

Next, an example of a manufacturing method for an FeRAM shown in FIG. 8 will be described.

Figure 12:
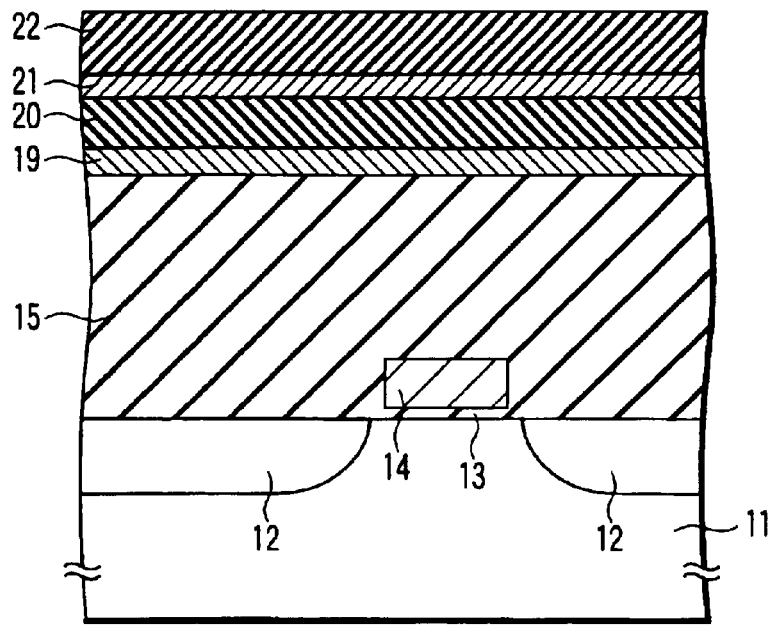
FIG. 12 is a diagram showing one process of a memory cell manufacturing method according to the example of the present invention.

First, as shown in FIG. 12, a cell transistor formed from the source/drain regions 12, the gate insulating layer 13, and the gate electrode 14, is formed on the silicon substrate 11 by using a CMOS technique. Here, a concrete manufacturing method for a cell transistor will be omitted.

Thereafter, for example, the insulating layer (for example, silicon oxide) 15 entirely covering the cell transistor is formed by using an LPCVD method. The surface of the insulting layer 15 is flattened by using CMP (Chemical Mechanical Polishing).

Further, for example, by using a spattering method, the bottom electrode (for example, Pt, Ir, $IrO_2$, or the like) 19 is formed on the insulating layer 15, the ferro-electric (for example, PZT, SBT, or the like) 20 is formed on the bottom electrode 19, and the top electrode (for example, Pt, Ir, $IrO_2$, or the like) 21 is formed on the ferro-electric 20.

Note that, with respect to the forming of the ferro-electric 20, for example, a CVD method, a sol-gel method, a CSD method, or the like may be used in place of the spattering method.

Thereafter, patterning is carried out on the ferro-electric 20 and the top electrode 21 by using, for example, RIE. Here, with respect to a patterning method for a member by RIE, there are two methods of a method in which a photo mask itself is used as a mask material, and a method in which a pattern of a photo mask is transferred to a hard mask formed from $SiO_2$ or the like, and the hard mask is used as a mask material.

In the method in which a photo mask is used as a mask material, there is the advantage that the number of process is small, and the method is simple. However, there is the disadvantage that a temperature at the time of RIE cannot be sufficiently raised because the photo mask cannot withstand a high-temperature. Therefore, this method is not suitable for etching in which a material whose vapour pressure is low is an object.

In contrast, in the method in which a hard mask is used as a mask material, there is the disadvantage that the number of the processes increases. However, there are great advantages that, firstly, because the temperature at the time of RIE can be sufficiently raised, this method is suitable for etching in which a material whose vapour pressure is low is an object, and secondly, because there are a large number of cases in which an etching selectivity of a member to be etched with respect to the hard mask can be made to be high, the thickness of the hard mask itself can be relatively made thin.

Therefore, here, an example of the latter case in which a hard mask is used will be described. However, any of the above-described two methods may be applied to the example of the invention.

First, as shown in FIG. 12, for example, by using a plasma CVD method, an insulating layer (for example, silicon oxide) 22 which will be a hard mask is formed on the top electrode 21.

Figure 13:
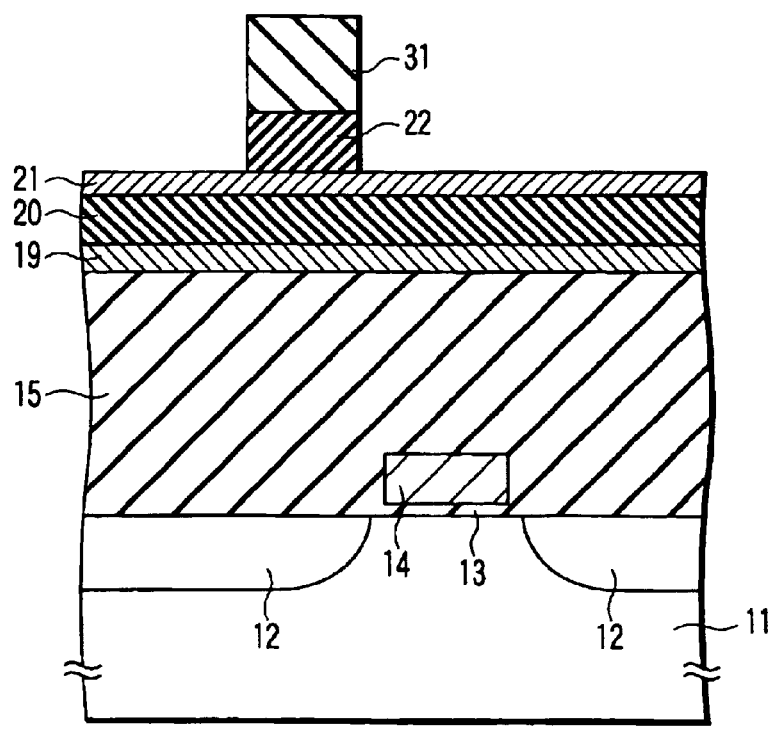
FIG. 13 is a diagram showing one process of the memory cell manufacturing method according to the example of the present invention.

Next, as shown in FIG. 13, a photo mask (resist pattern) 31 is formed by carrying out PEP (Photo Engraving Process). The insulating layer 22 is etched by RIE by using the photo mask 31 as a mask, and the pattern of the photo mask 31 is transferred to the insulating layer 22. As a result, a hard mask formed from the insulating layer 22 is formed. Thereafter, the photo mask 31 is removed by ashing.

Figure 14:
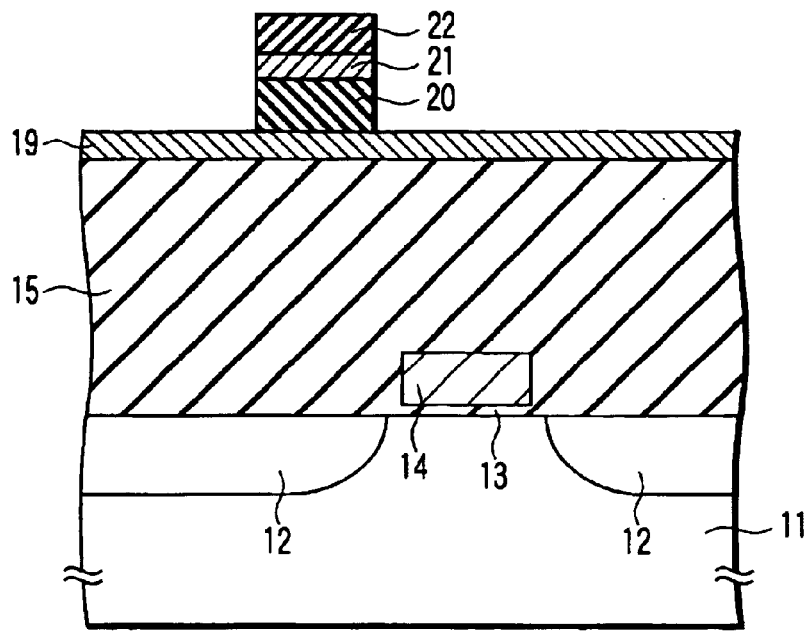
FIG. 14 is a diagram showing one process of the memory cell manufacturing method according to the example of the present invention.

Subsequently, as shown in FIG. 14, the top electrode 21 and the ferro-electric 20 are etched by carrying out RIE by using the hard mask formed from the insulating layer 22 as a mask. As a result, the patterns of the ferro-electric 20 and the top electrode 21 are completed.

Here, because the insulating layer 22 serving as a hard mask is etched by RIE to some extent, the thickness of the insulating layer 22 is thinner in the state after the RIE than in the state before the RIE. Further, the insulating layer 22 serving as a hard mask may be removed after the RIE is completed. However, in the present embodiment, in order to simplify the process, the insulating layer 22 is left as is.

Figure 15:
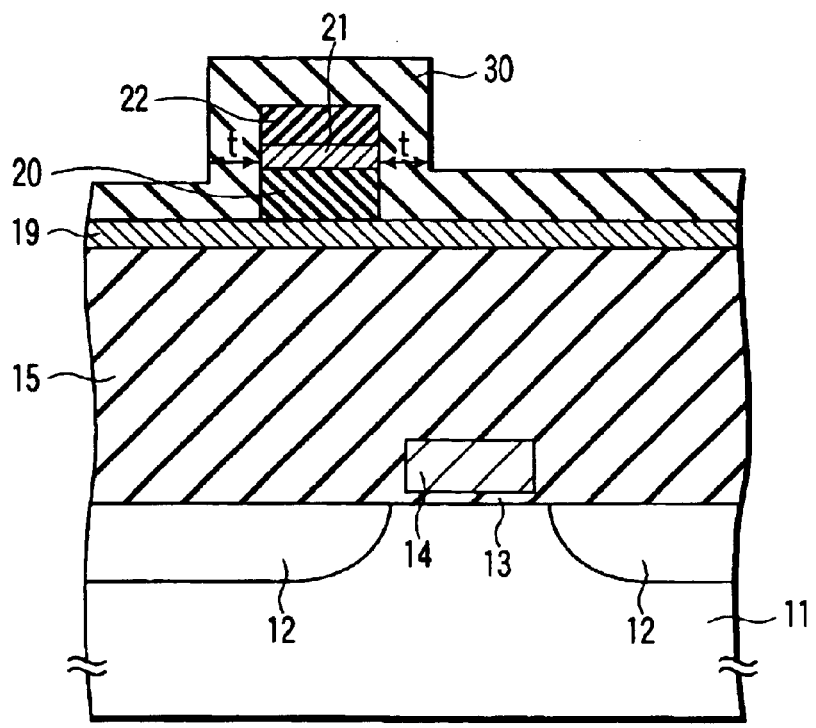
FIG. 15 is a diagram showing one process of the memory cell manufacturing method according to the example of the present invention.

Thereafter, as shown in FIG. 15, for example, by using a spattering method, the high-dielectric (for example, SiN, TaO$_2$, TiO$_2$, Al$_2$O$_3$, ZrO$_2$, HfO$_2$, BST, PZT, SBT, or the like) 30 is formed so as to entirely cover the bottom electrode 19, the top electrode 21, and the ferro-electric 20.

Note that, with respect to the forming of the high-dielectric 30, in place of the spattering method, for example, a CVD method may be used.

Here, a thickness or an accumulation amount of the high-dielectric 30 will be studied.

At the end portions of the cell capacitor, some of the electric lines of force extend from one electrode via the high-dielectric 30 up to the other electrode. Namely, when the thickness of the high-dielectric 30 is too thin, some of the electric lines of force passe through the high-dielectric 30, and spread out up to the insulating layer (for example, silicon oxide) which exists at the outside thereof and has a low dielectric constant.

In such a structure, the electric field relaxation at the end portions of the cell capacitor cannot be sufficiently suppressed, the loss in electrostatic energy arises.

However, the thickness of the high-dielectric 30 cannot be unlimitedly made thick.

This is because, firstly, at the periphery of the cell capacitor, for example, as shown in FIG. 8, various wirings, for example, the gate electrode 14, the wirings 28, 29, and the like exist. Namely, the high-dielectric 30 is merely an interlayer insulating layer, and if the amount of such an interlayer insulating layer having a high dielectric constant is increased, the parasitic capacitance between wirings becomes large, which harmfully affects the operations of the FeRAM.

This is because, secondly, the larger the thickness of the high-dielectric 30, the greater the mechanical stress that the high-dielectric 30 applies to the cell capacitor. Namely, due to this mechanical stress, problems such as film peeling, the cell capacitor no longer functioning as a data storage element, and the like, arise.

Accordingly, the thickness or the accumulation amount of the high-dielectric 30 is set to a value in which the loss in electrostatic energy due to the spreading of the electric lines of force can be suppressed without the problems of the parasitic capacitance and the mechanical stress. It has been verified by experimentation that this value is substantially equal to the thickness of the ferro-electric 20, i.e., the distance from the bottom electrode 19 to the top electrode 21.

By the way, here, "the thickness of the high-dielectric 30" is the thickness of the portions which affect the electric lines of force due to the cell capacitor. Namely, "the thickness of the high-dielectric 30" is concretely the thickness t, in the direction parallel to the silicon substrate 11 of the high-dielectric 30, at the side wall portions of the bottom electrode 19, the ferro-electric 20, and the top electrode 21 which configure the cell capacitor.

Figure 30:
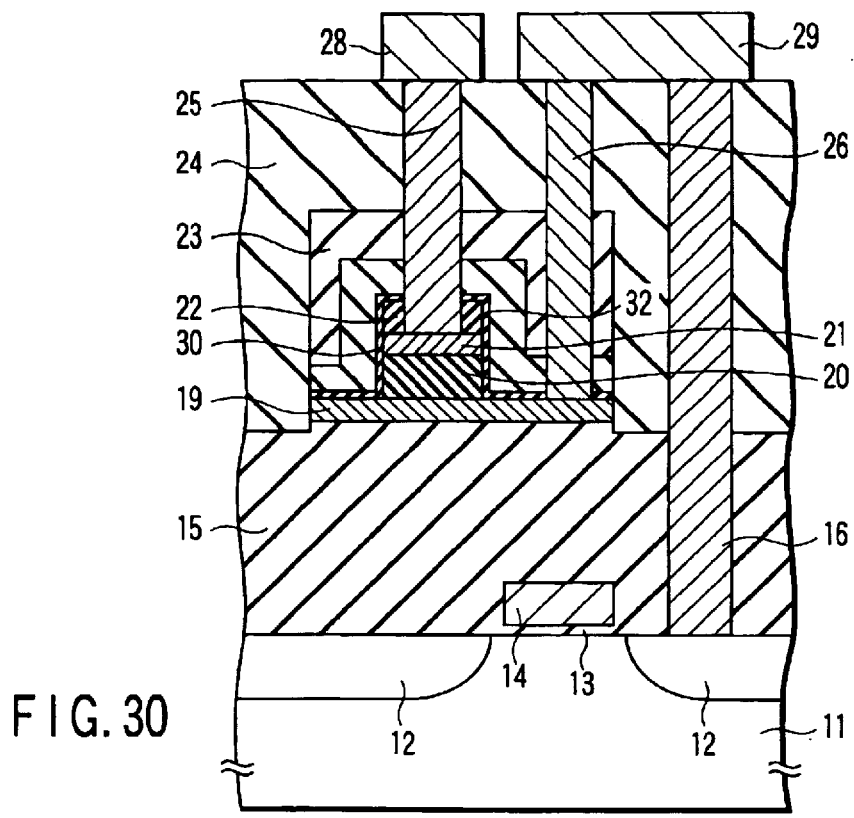
FIG. 30 is a diagram showing a modified example of the memory cell of FIG. 8.

Note that there are cases in which the characteristic of the ferro-electric 20 deteriorates if the high-dielectric 30 directly contact the ferro-electric 20. In such a case, for example, as shown in FIG. 30, it suffices that a barrier layer 32 for preventing these reactions is disposed between the ferro-electric 20 and the high-dielectric 30.

Next, patterning of the bottom electrode 19 is carried out. At this time, at the same time, patterning of the high-dielectric 30 as well is carried out, excessive high-dielectric 30 is removed.

Here, with respect to the patterning of the bottom electrode 19, in the same way as in the patterning of the ferro-electric 20 and top electrode 21, there are two methods of a method in which the photo mask itself is used as a mask material, and a method in which a pattern of a photo mask is transferred to a hard mask formed from SiO$_2$ or the like, and the hard mask is used as a mask material.

With respect to the patterning of the bottom electrode 19 as well, because RIE under a high temperature is supposed in the same way as in the patterning of the ferro-electric 20 and top electrode 21, here, an example of the latter case in which a hard mask is used will be described.

However, with respect to the example of the invention, in the same way as in the patterning of the ferro-electric 20 and top electrode 21, the former method in which a photo mask is used may be applied.

Figure 16:
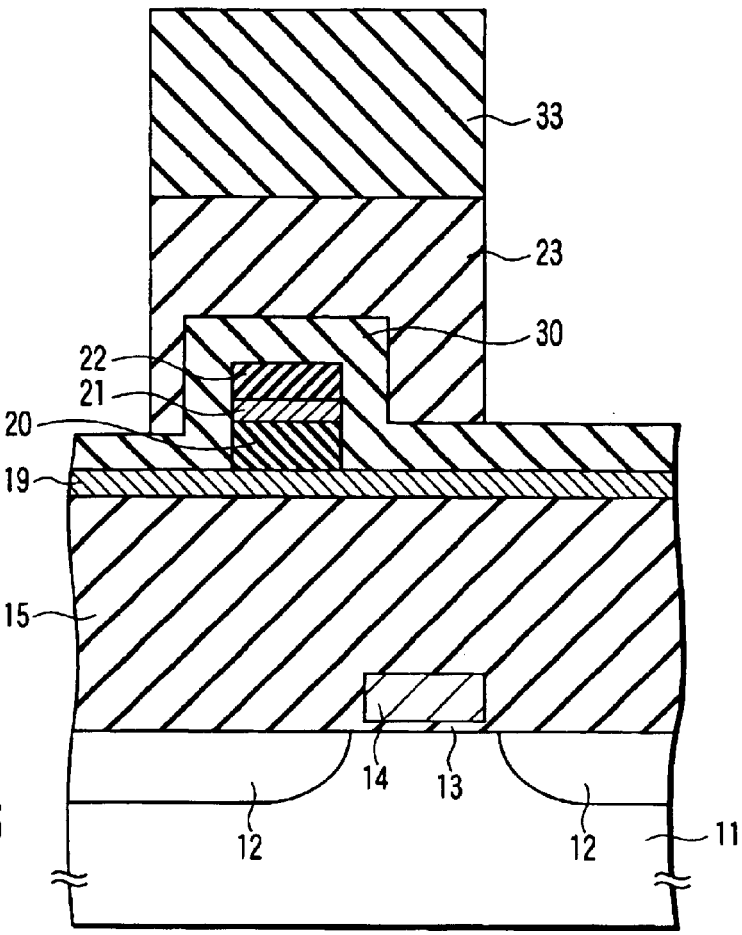
FIG. 16 is a diagram showing one process of the memory cell manufacturing method according to the example of the present invention.

First, as shown in FIG. 16, for example, by using a plasma CVD method, the insulating layer (for example, silicon oxide) 23 which will be a hard mask is formed on the high-dielectric 30.

Thereafter, a photo mask (resist pattern) 33 is formed by carrying out PEP (Photo Engraving Process). The insulating layer 23 is etched by RIE by using the photo mask 33 as a mask, and the pattern of the photo mask 33 is transferred to the insulating layer 23. As a result, a hard mask formed from the insulating layer 23 is formed. Thereafter, the photo mask 33 is removed by ashing.

Figure 17:
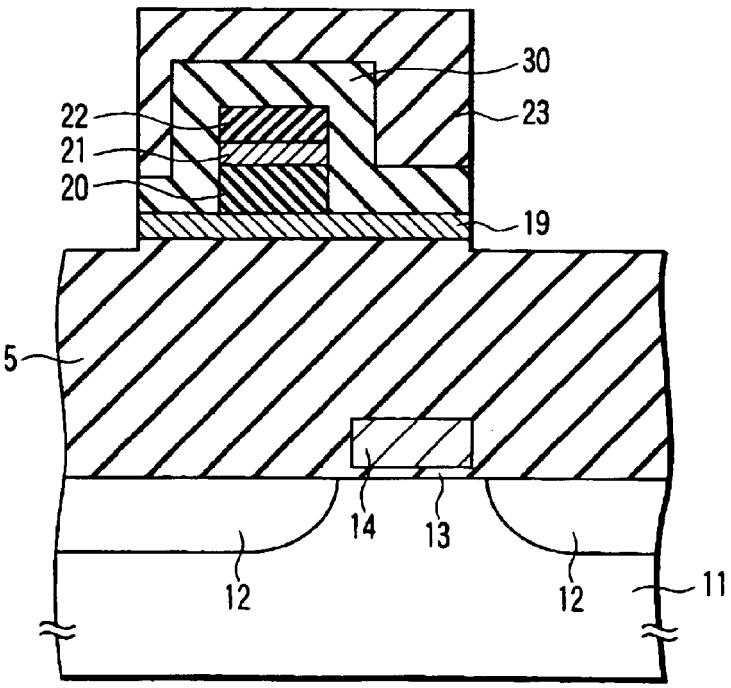
FIG. 17 is a diagram showing one process of the memory cell manufacturing method according to the example of the present invention.

Next, as shown in FIG. 17, the high-dielectric 30 and the bottom electrode 19 are etched by carrying out RIE by using the hard mask formed from the insulating layer 23 as a mask. As a result, the patterns of the bottom electrode 19 and the high-dielectric 30 are completed.

Here, because the insulating layer 23 serving as a hard mask is etched to some extent by RIE, the thickness of the insulating layer 23 is made thinner in the state after the RIE than in the state before the RIE. Further, the insulating layer 23 serving as a hard mask may be removed after the RIE is completed. However, in the present embodiment, in order to simplify the process, the insulating layer 23 is left as is.

At the time of etching on the bottom electrode 19 and the high-dielectric 30 by RIE, the insulating layer (for example, silicon oxide) 15 which will be the front-end is etched to some extent by over-etching.

Figure 18:
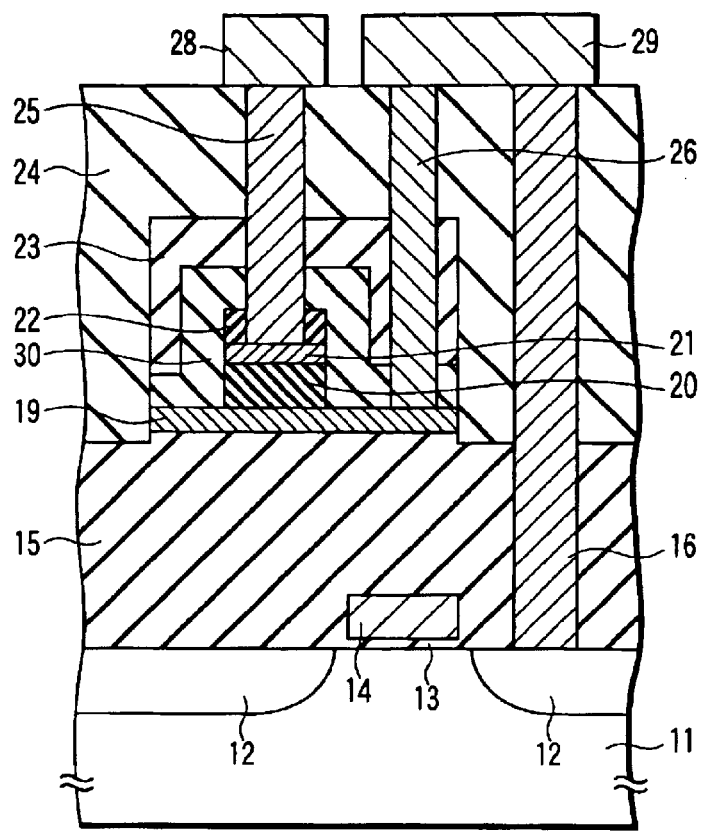
FIG. 18 is a diagram showing one process of the memory cell manufacturing method according to the example of the present invention.

Next, as shown in FIG. 18, for example, by an LPCVD method, the insulating layer (for example, silicon oxide) 24 is formed on the insulating layers 15 and 23. Further, the surface of the insulting layer 24 is flattened by carrying out CMP.

Thereafter, contact holes are formed by PEP and RIE. Here, with respect to the contact hole reaching the source/drain region 12 of the cell transistor, it suffices to carry out etching on the insulating layers (for example, silicon oxides) 15 and 24 which are formed from the same material.

However, with respect to the contact hole reaching the top electrode 21, after the insulating layers (for example, silicon oxides) 23 and 24 are etched, the high-dielectric 30 is etched, and thereafter, it is necessary to etch the insulating layer (for example, silicon oxide) 22.

Further, with respect to the contact hole reaching the bottom electrode 19, after the insulating layers (for example, silicon oxides) 23 and 24 are etched, it is necessary to etch the high-dielectric 30.

Namely, in a case of the device structure according to the embodiment, when the contact holes are formed, because the etching gas must be successively switched such as, for example, corresponding to silicon oxide ($SiO_2$) →corresponding to high-dielectric→corresponding to silicon oxide ($SiO_2$), the process is made complicated to some extent. This problem will be solved in the following embodiments.

Finally, the contact plugs 16, 25, and 26 are formed in the contact holes, and moreover, when the wirings 28 and 29 are formed on the contact plugs 16, 25, and 26, the FeRAM memory cell shown in FIG. 8 is completed.

(2) Second Embodiment

An FeRAM memory cell according to a second embodiment of the invention has a feature on a shape of a high-dielectric covering the periphery of a cell capacitor, as compared with that of the first embodiment described above.

Namely, in the above-described first embodiment, because the high-dielectric is formed over the relatively broad range at the periphery of the cell capacitor, there were the problems that, for example, firstly, the parasitic capacitance increases, and secondly, it is necessary to switch the etching gas when the contact holes with respect to the bottom/top electrodes of the cell capacitor are formed, and the process is made complicated to some extent, or the like.

In the second embodiment, due to the high-dielectric which is the feature of the capacitor according to the example of the invention being formed so as to be within the minimum range required, such problems of the parasitic capacitance, the problem on the process, or the like are solved.

[A] Structure

Figure 19:
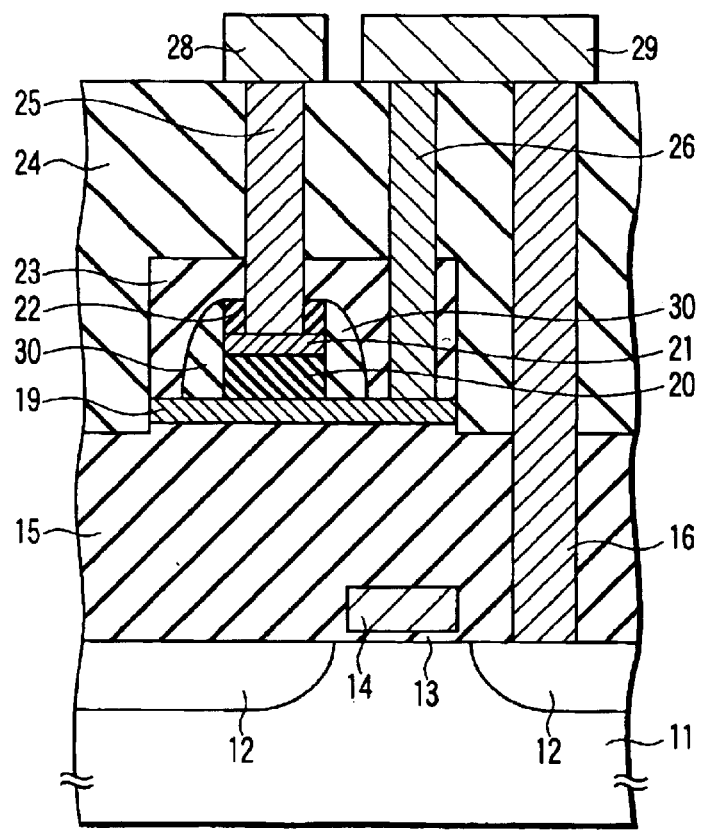
FIG. 19 a diagram showing an FeRAM memory cell according to a second embodiment of the present invention.

FIG. 19 shows the FeRAM memory cell according to the second embodiment of the invention.

In the same way as in the first embodiment, this memory cell has an offset type cell structure in which contact with respect to a bottom electrode of a cell capacitor is made from the top portion of the cell capacitor.

A cell transistor is formed on the silicon substrate 11. The cell transistor has the source/drain regions 12, the gate insulating layer 13, and the gate electrode 14. The cell transistor is covered with the insulating layer (for example, silicon oxide) 15.

Figure 20:
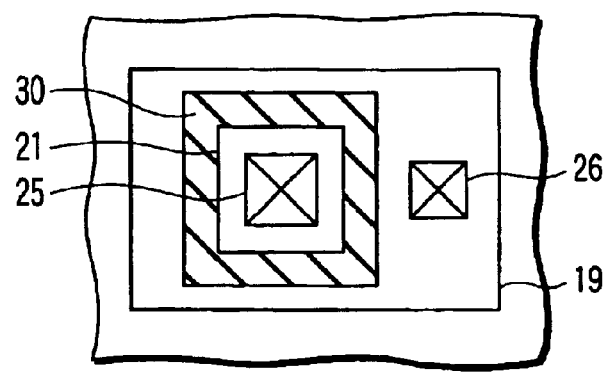
FIG. 20 is a diagram showing a planar layout of a cell capacitor.

The bottom electrode (for example, Pt) 19 of the cell capacitor is formed on the insulating layer 15. For example, as shown in FIG. 20, the bottom electrode 19 has a quadrangle in a case of being looked from the top thereof. Here, the edge portions of the quadrangle may be rounded.

The ferro-electric (for example, PZT, SBT, or the like) 20 is formed on the bottom electrode 19. The top electrode (for example, Pt) 21 is formed on the ferro-electric 20.

For example, as shown in FIG. 20, the top electrode 21 has a quadrangle in a case of being looked from the top thereof. Here, the edge portions of the quadrangle may be rounded. The top electrode 21 is smaller than the bottom electrode 19.

The insulating layer (for example, silicon oxide) 22 functioning as a mask when the ferro-electric 20 and the top electrode 21 are patterned, is formed on the top electrode 21.

Here, in the example of the invention, the high-dielectric (for example, SiN, $TaO_2$, $TiO_2$, $Al_2O_3$, $ZrO_2$, $HfO_2$, BST, PZT, SBT, or the like) 30 is formed so as to entirely cover the side wall portions of the ferro-electric 20 disposed between the bottom electrode 19 and the top electrode 21.

The high-dielectric 30 is formed from a material having a dielectric constant higher than the dielectric constants of the insulating layers (for example, silicon oxides) 23 and 24 which surround the high-dielectric 30 and which will be described later.

In the present embodiment, the high-dielectric 30 is formed so as to cover only the side wall portions of the ferro-electric 20 configuring the cell capacitor. Concretely, the high-dielectric 30 is formed at the side wall portions of the ferro-electric 20 as the so-called side wall insulating layer (sidewall). A planar pattern of the high-dielectric 30 is, for example, as shown in FIG. 20.

It is good that the thickness of the high-dielectric 30, i.e., the thickness in the direction parallel to the surface of the silicon substrate 11 is formed to be as thick as the thickness of the ferro-electric 20.

The insulating layer (for example, silicon oxide) 23 is formed on the high-dielectric 30. The insulating layer 23 functions as a mask when the bottom electrode 19 is patterned.

The insulating layer (for example, silicon oxide) 24 is formed on the insulating layer 23. A contact hole reaching the top electrode 21 is formed at the insulating layers 22, 23, and 24. The contact plug 25 is formed in this contact hole. The wiring 28 is formed on the contact plug 25.

Further, a contact hole reaching the bottom electrode 19 is formed at the insulating layers 23 and 24. The contact plug 26 is formed in this contact hole. In the same way, a contact hole reaching the source/drain region 12 is formed at the insulating layers 15 and 24. The contact plug 16 is formed in this contact hole. The wiring 29 is formed on the contact plugs 16 and 26.

Here, in the present embodiment, all of these contact holes do not pass through the high-dielectric 30. Namely, as will be described later, there is no need to switch the etching gas at the time of forming these contact holes.

Further, in the present embodiment, for example, by using a self aligning contact (SAC) technique, all of these contact holes can be simultaneously formed by carrying out etching one time.

Figure 31:
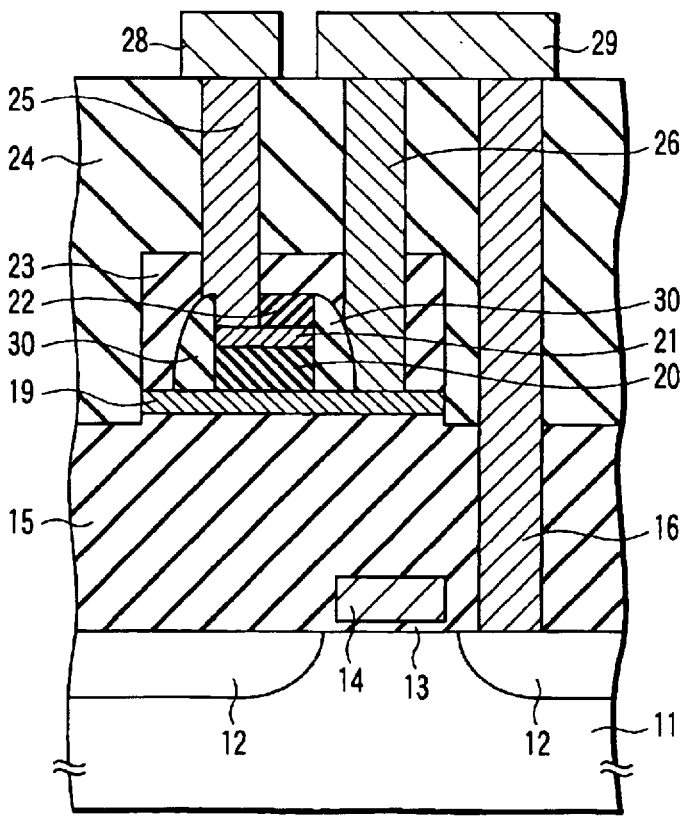
FIG. 31 is a diagram showing a modified example of the memory cell of FIG. 19.

For example, as shown in FIG. 31, even if the position of the contact hole with respect to the bottom electrode 19 and the top electrode 21 is shifted, by using a difference between the etching rates of the insulating layer (for example, silicon oxide) 23 and the high-dielectric 30, the contact hole with respect to the bottom electrode 19 and the top electrode 21 can be formed by the SAC.

In accordance with such a structure, in the same way as in the first embodiment, the end portions of the cell capacitor configuring the FeRAM memory cell are covered with the high-dielectrics having a dielectric constant higher than a dielectric constant of an interlayer insulating layer formed from silicon oxide ($SiO_2$) or the like.

Accordingly, the electric field relaxation at the end portions of the cell capacitor can be eliminated, and the ferro-electric 20 can be efficiently polarized at the end portions of the cell capacitor. Further, the S/N ratio of a semiconductor memory using the capacitor as a data storage element can be improved.

Moreover, in the second embodiment, because the high-dielectric 30 is disposed in the minimum space required, the above-described effects can be obtained without causing the problems of an increase in parasitic capacitance, the process at the time of forming the contact holes becoming complicated, or the like.

Note that, in the second embodiment, differently from the first embodiment, the high-dielectric 30 is formed at the side wall portions of the ferro-electric 20.

Accordingly, the side surfaces of the cell capacitor must be made perpendicular or close to being perpendicular to the surface of the silicon substrate 11. In the second embodiment, it is not preferable that a capacitor structure having a tapered shape as shown in FIG. 5 is used.

[B] Manufacturing Method

Next, an example of a manufacturing method for an FeRAM shown in FIG. 19 will be simply described.

Most of the manufacturing method for the FeRAM shown in FIG. 19 are the same as the manufacturing method (FIGS. 12 to 18) for the FeRAM shown in FIG. 8.

The manufacturing method for the FeRAM shown in FIG. 19 is different from the manufacturing method for the FeRAM shown in FIG. 8 in two methods of a forming method for the high-dielectric 30 and a forming method for contact holes.

First, the forming method for the high-dielectric 30 will be described with reference to FIG. 19.

After the top electrode 21 and the ferro-electric 20 are etched by RIE by using the insulating layer (for example, silicon oxide) 22 as a hard mask, the high-dielectric 30 is accumulated on the entire surface of the silicon substrate 11 by using a spattering method or a CVD method.

The high-dielectric 30 is etched by entire-surface etch back, and the high-dielectric 30 is left at only the side wall portions of the ferro-electric 20. Here, an etching selectivity of the high-dielectric 30 and the bottom electrode 19 which will be the front-end thereof must be made sufficiently large.

However, with respect to the insulating layer 22, etching may be carried out under the condition such that the insulating layer 22 is completely removed at the point in time when the etching is completed.

Next, the forming method for the contact holes will be described.

In the device structure shown in FIG. 19, because the high-dielectric 30 does not exist in the region at which the contact holes are formed, there is no need to switch the etching gas for RIE during the etching. Namely, all of the insulating layers 15, 22, 23, and 24 which are the objects for being etched, are, for example, silicon oxides.

Accordingly, for example, by PEP, a photo mask is formed, and the contact holes for the contact plugs 16, 25, and 26 are formed by RIE by using the photo mask as a mask. All of these contact holes may be simultaneously formed, or may be separately formed.

(3) Third Embodiment

An FeRAM memory cell according to a third embodiment of the invention has a feature on a shape of a high-dielectric which covers the periphery of a cell capacitor, as compared with that of the first embodiment described above.

Namely, in the structure of the first embodiment shown in FIG. 8, at the time of carrying out patterning of the bottom electrode, the hard mask formed from the insulating layer 23 is formed, and the high-dielectric and the bottom electrode are etched by RIE by using the hard mask as a mask.

However, in this case, the problem that the process is made complicated by an amount corresponding to the amount of forming the hard mask formed from the insulating layer 23.

Therefore, in the third embodiment, an attempt is made to simplify the process by omitting the insulating layer 23 in FIG. 8, and using the high-dielectric itself as a hard mask, and etching the bottom electrode by RIE by using the hard mask.

[A] Structure

Figure 21:
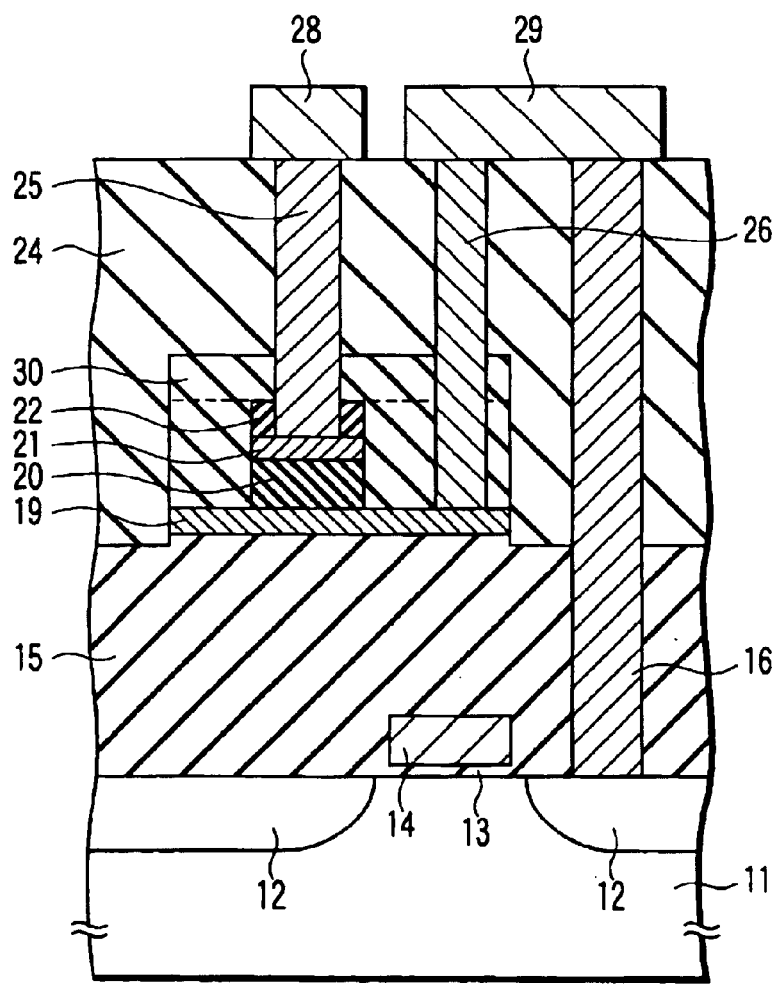
FIG. 21 a diagram showing an FeRAM memory cell according to a third embodiment of the present invention.

FIG. 21 shows the FeRAM memory cell according to the third embodiment of the invention.

In the same way as in the first embodiment, this memory cell has an offset type cell structure in which contact with respect to a bottom electrode of a cell capacitor is made from the top portion of the cell capacitor.

A cell transistor is formed on the silicon substrate 11. The cell transistor has the source/drain regions 12, the gate insulating layer 13, and the gate electrode 14. The cell transistor is covered with the insulating layer (for example, silicon oxide) 15.

The bottom electrode (for example, Pt) 19 of the cell capacitor is formed on the insulating layer 15. For example, in a case of being looked from the top thereof, the bottom electrode 19 has a quadrangle. Here, the edge portions of the quadrangle may be rounded.

The ferro-electric (for example, PZT, SBT, or the like) 20 is formed on the bottom electrode 19. The top electrode (for example, Pt) 21 is formed on the ferro-electric 20.

For example, the top electrode 21 has a quadrangle in a case of being looked from the top thereof. Here, the edge portions of the quadrangle may be rounded. The top electrode 21 is smaller than the bottom electrode 19.

The insulating layer (for example, silicon oxide) 22 functioning as a mask when the ferro-electric 20 and the top electrode 21 are patterned, is formed on the top electrode 21.

Here, in the example of the present invention, the high-dielectric (for example, SiN, $TaO_2$, $TiO_2$, $Al_2O_3$, $ZrO_2$, $HfO_2$, BST, PZT, SBT, or the like) 30 is formed so as to surround the entire cell capacitor.

The high-dielectric 30 is formed from a material having a dielectric constant higher than the dielectric constant of the insulating layer (for example, silicon oxide) 24 which is disposed at the periphery of the high-dielectric 30 and will be described later.

In the present embodiment, the high-dielectric 30 functions as a hard mask when the bottom electrode 19 is patterned. Namely, it can be thought that the high-dielectric 30 in FIG. 21 is configured such that the high-dielectric 30 and the insulating layer 23 in FIG. 8 are put together into one high-dielectric 30.

The top surface of the high-dielectric 30 may exist higher than the top surface of the insulating layer 22, and as shown by the broken line, the top surface of the high-dielectric 30 may be substantially the same height as that of the top surface of the insulating layer 22, or may exist lower than the top surface of the insulating layer 22.

The positional relationship between the top surface of the high-dielectric 30 and the top surface of the insulating layer 22 is determined in accordance with a thickness of the high-dielectric 30 immediately after being accumulated.

If the top surface of the high-dielectric 30 is made to be substantially the same height as that of the top surface of the insulating layer 22, or is disposed lower than the top surface of the insulating layer 22, because there is no need to etch the high-dielectric 30 at the time of forming the contact hole with respect to the top electrode 21, the process is simplified.

The insulating layer (for example, silicon oxide) 24 is formed on high-dielectric 30. A contact hole reaching the top electrode 21 is formed at the insulating layers 22 and 24 (and the high-dielectric 30). The contact plug 25 is formed in this contact hole. The wiring 28 is formed on the contact plug 25.

Further, a contact hole reaching the bottom electrode 19 is formed at the insulating layer 24 and the high-dielectric 30. The contact plug 26 is formed in this contact hole. In the same way, a contact hole reaching the source/drain region 12 of the cell transistor is formed at the insulating layers 15 and 24. The contact plug 16 is formed in this contact hole. The wiring 29 is formed on the contact plugs 16 and 26.

In accordance with such a structure, in the same way as in the first embodiment, the end portions of the cell capacitor configuring the FeRAM memory cell are covered with the high-dielectrics having a dielectric constant higher than a dielectric constant of an interlayer insulating layer formed from silicon oxide ($SiO_2$) or the like.

Accordingly, the electric field relaxation at the end portions of the cell capacitor can be eliminated, and the ferro-electric 20 can be efficiently polarized at the end portions of the cell capacitor. The S/N ratio of a semiconductor memory using the capacitor as a data storage element can be improved.

Moreover, in the third embodiment, the high-dielectric 30 is used as a hard mask at the time of patterning of the bottom electrode 19, which can contribute to simplifying the process.

Note that, in the third embodiment, in the same way as in the first embodiment, for example, the side surfaces of the cell capacitor may be formed to be a tapered shape as the capacitor of FIG. 5.

[B] Manufacturing Method

Next, an example of a manufacturing method for an FeRAM shown in FIG. 21 will be simply described.

Most of the manufacturing method for the FeRAM shown in FIG. 21 are the same as the manufacturing method (FIGS. 12 to 18) for the FeRAM shown in FIG. 8.

The manufacturing method for the FeRAM shown in FIG. 21 is different from the manufacturing method for the FeRAM shown in FIG. 8 in three methods of a forming method for the high-dielectric 30, a patterning method for the bottom electrode 19, and a forming method for the contact holes.

First, the forming method for the high-dielectric 30 will be described with reference to FIG. 21.

After the top electrode 21 and the ferro-electric 20 are etched by RIE by using the insulating layer (for example, silicon oxide) 22 as a hard mask, the high-dielectric 30 is accumulated on the entire surface of the silicon substrate 11 by using a spattering method or a CVD method.

A photo mask (resist pattern) is formed by PEP, and the high-dielectric 30 is etched by RIE by using the photo mask as a mask. At this time, because the high-dielectric 30 must be etched at room temperature, as the etching gas, a gas which is optimum for etching on the high-dielectric 30 is used.

Thereafter, the photo mask is removed by ashing.

The high-dielectric 30 serving as a hard mask is thereby formed.

Next, the patterning method for the bottom electrode 19 will be described.

After the high-dielectric 30 serving as a hard mask is formed, the bottom electrode 19 is etched by RIE by using the hard mask as a mask.

Here, by controlling the thickness of the high-dielectric 30 at the time of being accumulated, for example, after the RIE is completed, the top surface of the high-dielectric 30 can be made to be the same height as that of the top surface of the insulating layer 22, or the top surface of the high-dielectric 30 can be made to be lower than the top surface of the insulating layer 22.

For example, as shown by the broken line in FIG. 21, provided that the top surface of the high-dielectric 30 and the top surface of the insulating layer 22 are set to be at the same positions, because there is no need to etch the high-dielectric 30 when the contact hole with respect to the top electrode 21 is formed, there is no need to switch the etching gas, and the process is simplified.

Next, the forming method for the contact holes will be described.

For example, by PEP, a photo mask is formed, and the contact holes for the contact plugs 16, 25, and 26 are respectively formed by RIE by using the photo mask as a mask. All of these contact holes may be simultaneously formed, or may be separately formed.

As already described, for example, provided that the top surface of the high-dielectric 30 and the top surface of the insulating layer 22 are set to be at substantially the same positions, there is no need to etch the high-dielectric 30 when the contact hole with respect to the top electrode 21 is formed, and the process is simplified.

(4) Fourth Embodiment

The FeRAM memory cells according to the above-described first to third embodiments have an offset type cell structure in which contact with respect to the bottom electrode of the cell capacitor is made from the top portion of the cell capacitor. In a fourth embodiment of the invention, an FeRAM formed from a memory cell having a COP (Capacitor On Plug) structure in which contact with respect to the bottom electrode of the cell capacitor is made from the bottom portion of the cell capacitor.

[A] Structure

Figure 22:
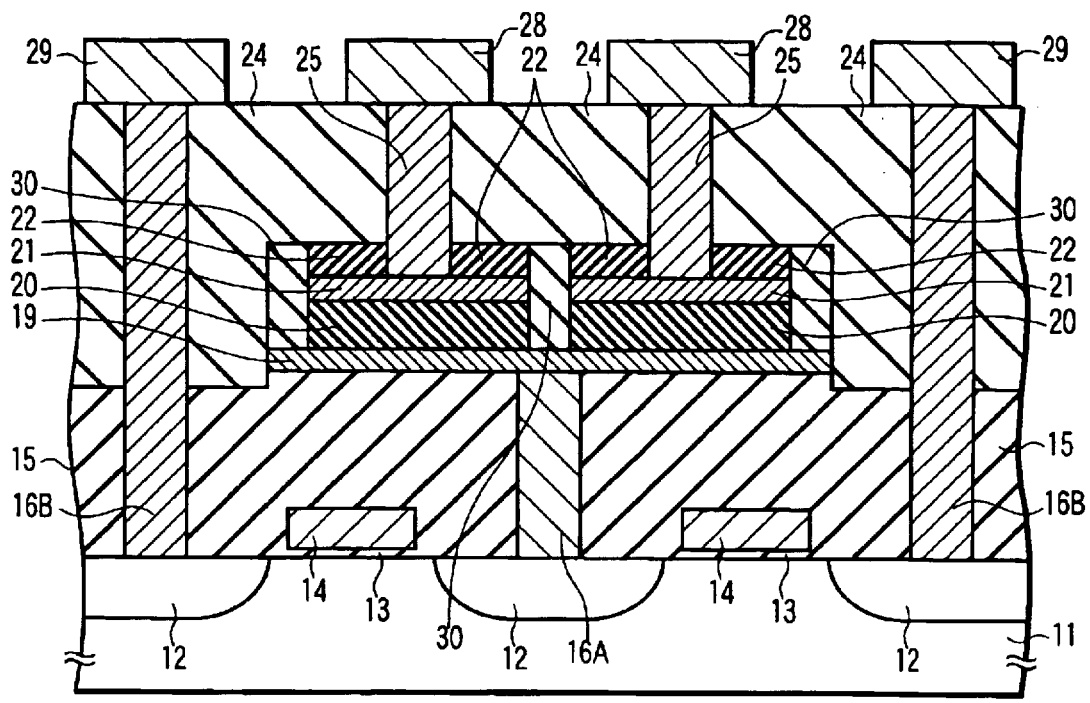
FIG. 22 a diagram showing an FeRAM memory cell according to a fourth embodiment of the present invention.

FIG. 22 shows an FeRAM memory cell according to the fourth embodiment of the present invention.

A cell transistor is formed on the silicon substrate 11. The cell transistor has the source/drain regions 12, the gate insulating layers 13, and the gate electrodes 14. The cell transistor is covered with the insulating layer (for example, silicon oxide) 15.

Contact holes reaching the source/drain regions 12 are formed at the insulating layers 15, and contact plugs 16A are formed in the contact holes.

Figure 23:
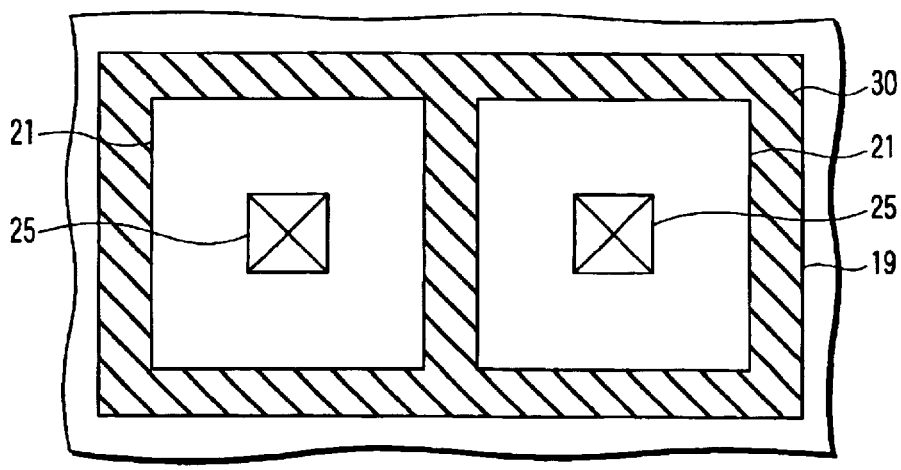
FIG. 23 is a diagram showing a planar layout of a cell capacitor.

The bottom electrode (for example, Pt) 19, which contact the contact plug 16A, of the cell capacitor is formed on the insulating layer 15. For example, as shown in FIG. 23, the bottom electrode 19 has a quadrangle in a case of being looked from the top thereof. Here, the edge portions of the quadrangle may be rounded.

In the present embodiment, the bottom electrode 19 is commonly used by two memory cells.

The ferro-electric (for example, PZT, SBT, or the like) 20 is formed on the bottom electrode 19. The top electrode (for example, Pt) 21 is formed on the ferro-electric 20.

For example, as shown in FIG. 23, the top electrode 21 has a quadrangle in a case of being looked from the top thereof. Here, the edge portions of the quadrangle may be rounded. The top electrode 21 is smaller than the bottom electrode 19.

The insulating layer (for example, silicon oxide) 22 functioning as a mask when the ferro-electric 20 and the top electrode 21 are patterned, is formed on the top electrode 21.

Here, in the example of the invention, the high-dielectric (for example, SiN, $TaO_2$, $TiO_2$, $Al_2O_3$, $ZrO_2$, $HfO_2$, BST, PZT, SBT, or the like) 30 is formed so as to entirely cover the side wall portions of the ferro-electric 20 disposed between the bottom electrode 19 and the top electrode 21.

The high-dielectric 30 is formed from a material having a dielectric constant higher than the dielectric constant of insulating layer (for example, silicon oxides) 24 which will be described later.

In the present embodiment, for example, as shown in FIG. 23, the high-dielectric 30 entirely covers the side surfaces of the cell capacitor, i.e., the side surfaces of the ferro-electric 20 and the top electrode 21.

It is good that the thickness of the high-dielectric 30, i.e., the thickness in the direction parallel to the surface of the silicon substrate 11 is formed to be as thick as the thickness of the ferro-electric 20. The high-dielectric 30 functions as a hard mask when the bottom electrode 19 is patterned.

The insulating layer (for example, silicon oxide) 24 is formed on the cell capacitor. Contact holes reaching the top electrode 21 are formed at the insulating layers 22 and 24. The contact plugs 25 are formed in the contact holes. The wirings 28 are formed on the contact plugs 25.

Further, contact holes reaching the source/drain regions 12 are formed at the insulating layers 15 and 24. Contact plugs 16B are formed in the contact holes. The wirings 29 are formed on the contact plugs 16B.

In accordance with such a structure, the end portions of the cell capacitor configuring the FeRAM memory cell are covered with the high-dielectric having a dielectric constant higher than a dielectric constant of an interlayer insulating layer formed from silicon oxide ($SiO_2$) or the like.

In this case, the spreading, in the transverse direction, of the electric lines of force at the end portions of the cell capacitor is smaller than the spreading, in the transverse direction, of the electric lines of force at the end portions of the conventional cell capacitor. Therefore, according to the example of the present invention, the electric field relaxation at the end portions of the cell capacitor can be eliminated, and the ferro-electric 20 can be efficiently polarized at the end portions of the cell capacitor.

In this way, in the example of the invention, the loss in electrostatic energy due to the swelling of the electric lines of force can be made to be small, and in accordance therewith, the capacitance of the capacitor can be improved, and therefore, the S/N ratio of a semiconductor memory using the capacitor as a data storage element can be improved.

Note that the side surfaces of the cell capacitor are perpendicular or substantially perpendicular to the surface of the silicon substrate 11. However, for example, as the capacitor in FIG. 5, the side surfaces of the cell capacitor may be formed to be a tapered shape.

The present embodiment is described by using the case of the FeRAM. However, the present embodiment can be easily applied to other semiconductor memories using a capacitor as a memory cell, for example, DRAMs. In this case, the dielectric configuring the cell capacitor may be replaced from a "ferro-electric" to a "high-dielectric".

[B] Manufacturing Method

Next, an example of a manufacturing method for an FeRAM shown in FIG. 22 will be described.

Figure 24:
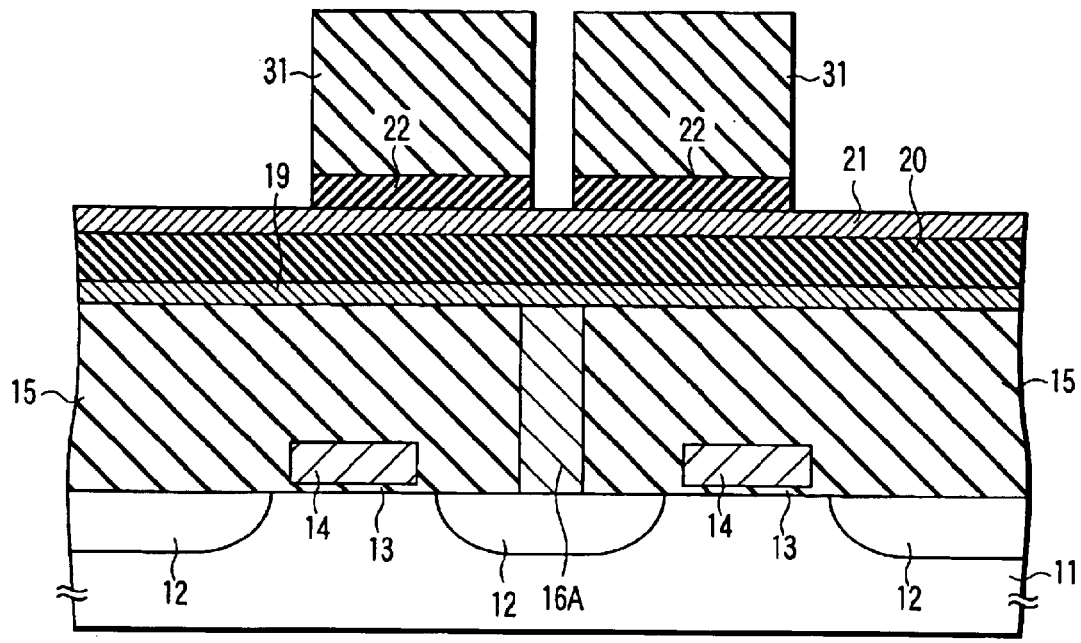
FIG. 24 is a diagram showing one process of a memory cell manufacturing method according to the example of the present invention.

First, as shown in FIG. 24, a cell transistor formed from the source/drain regions 12, the gate insulating layers 13, and the gate electrodes 14 is formed on the silicon substrate 11 by using a CMOS technique. Here, a concrete manufacturing method for a cell transistor will be omitted.

Thereafter, for example, by using an LPCVD method, the insulating layer (for example, silicon oxide) 15 entirely covering the cell transistor is formed. The surface of the insulting layer 15 is flattened by using CMP (Chemical Mechanical Polishing).

Further, for example, by using PEP (Photo Engraving Process) and RIE, a contact hole reaching the source/drain region 12 is formed at the insulating layer 15. For example, by an LPCVD method, a conductive layer (for example, conductive polycrystalline silicon) is filled into the contact hole, and the conductive layer which protrudes out from the contact hole is removed. In accordance therewith, the contact plug 16A is formed.

Thereafter, for example, by a spattering method, the bottom electrode (for example, Pt, Ir, $IrO_2$, or the like) 19 is formed on the insulating layer 18, and the ferro-electric (for example, PZT, SBT, or the like) 20 is formed on the bottom electrode 19, and the top electrode (for example, Pt, Ir, $IrO_2$, or the like) 21 is formed on the ferro-electric 20.

Note that, with respect to the forming of the ferro-electric 20, for example, a CVD method, a sol-gel method, a CSD method, or the like may be used in place of the spattering method.

Thereafter, the ferro-electric 20 and the top electrode 21 are patterned by using, for example, RIE. Here, with respect to a patterning method for a member by RIE, in the same way as in the first to third embodiments, any one of a method in which a photo mask itself is used as a mask material, and a method in which a pattern of a photo mask is transferred to a hard mask formed from $SiO_2$ or the like, and the hard mask is used as a mask material, can be used.

Here, an example of the latter case in which a hard mask is used, will be described.

First, as shown in FIG. 24, for example, by using a plasma CVD method, the insulating layer (for example, silicon oxide) 22 which will be a hard mask is formed on the top electrode 21.

Further, the photo mask (resist pattern) 31 is formed by carrying out PEP (Photo Engraving Process). The insulating layer 22 is etched by RIE by using the photo mask 31 as a mask, and the pattern of the photo mask 31 is transferred to the insulating layer 22. As a result, a hard mask formed from the insulating layer 22 is formed. Thereafter, the photo mask 31 is removed by ashing.

Figure 25:
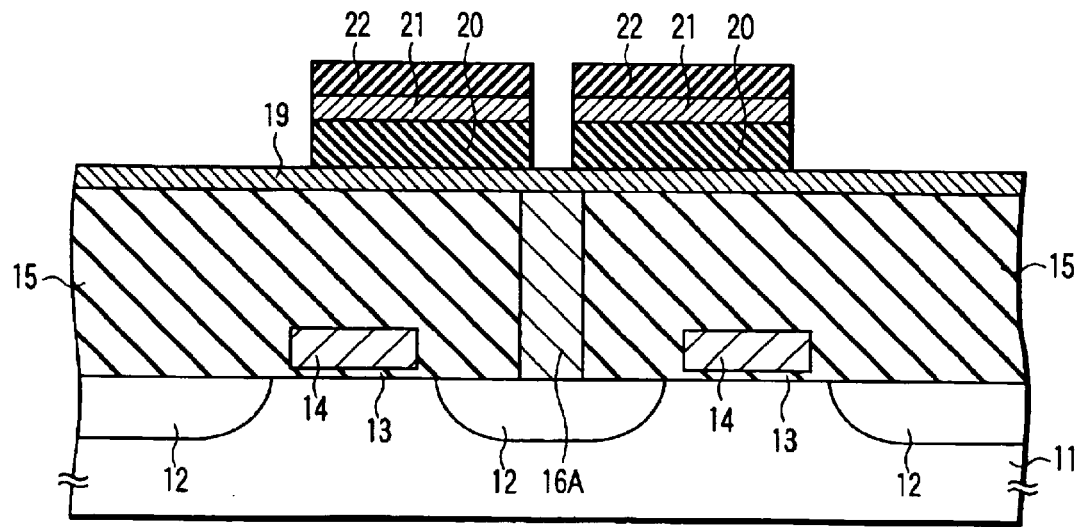
FIG. 25 is a diagram showing one process of the memory cell manufacturing method according to the example of the present invention.

Next, as shown in FIG. 25, the top electrode 21 and the ferro-electric 20 are etched by carrying out RIE by using the hard mask formed from the insulating layer 22 as a mask. As a result, the patterns of the ferro-electric 20 and the top electrode 21 are completed.

Here, because the insulating layer serving 22 as a hard mask is etched to some extent by RIE, the thickness thereof becomes thinner in the state after the RIE than in the state before the RIE. Further, the insulating layer 22 serving as a hard mask may be removed after the RIE is completed. However, in the present embodiment, in order to simplify the process, the insulating layer 22 serving as a hard mask is left as is.

Figure 26:
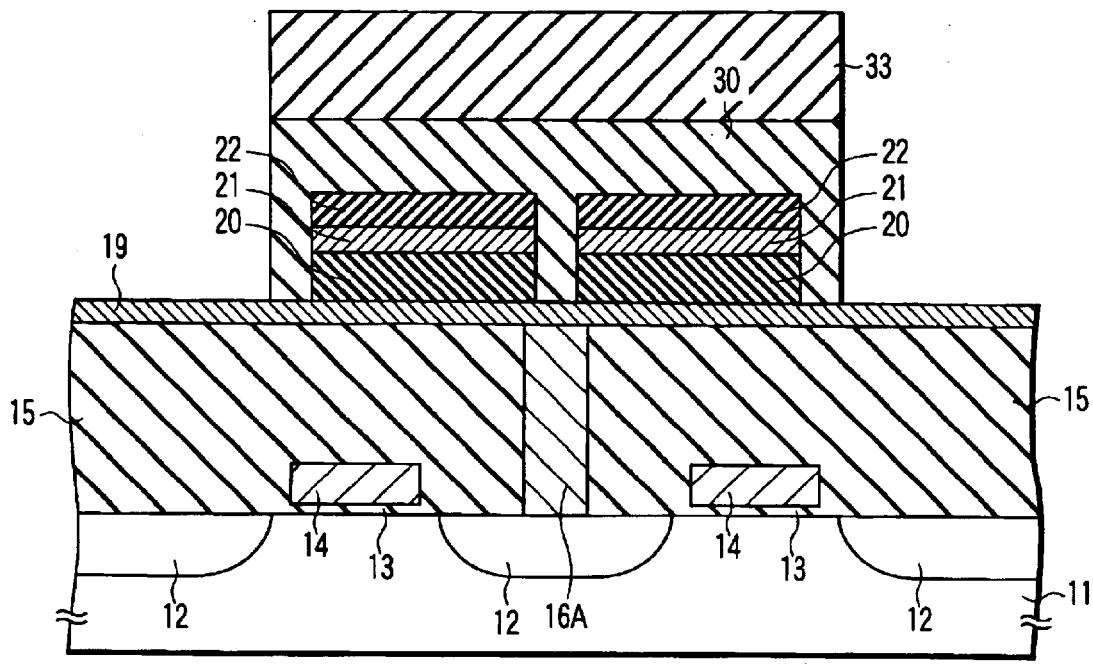
FIG. 26 is a diagram showing one process of the memory cell manufacturing method according to the example of the present invention.

Thereafter, as shown in FIG. 26, for example, by using a spattering method, the high-dielectric (for example, SiN, $TaO_2$, $TiO_2$, $Al_2O_3$, $ZrO_2$, $HfO_2$, BST, PZT, SBT, or the like) 30 is formed so as to entirely cover the bottom electrode 19, the top electrode 21, and the ferro-electric 20.

Note that, with respect to the forming of the high-dielectric 30, in place of the spattering method, for example, a CVD method may be used.

Figure 32:
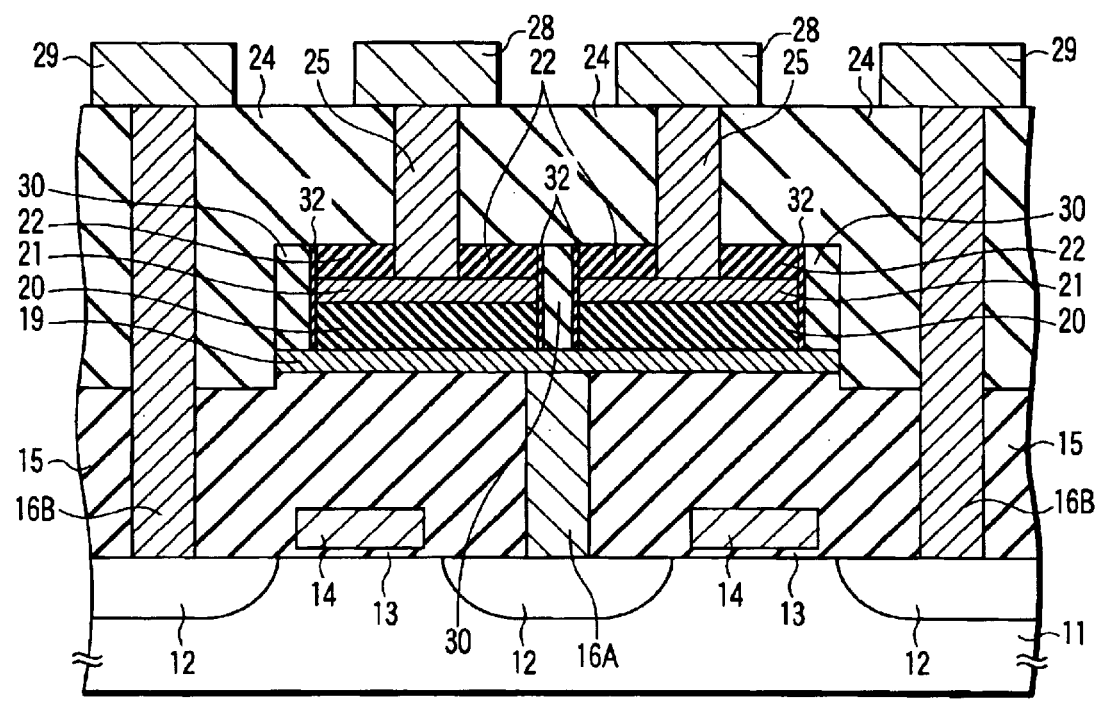
FIG. 32 is a diagram showing a modified example of the memory cell of FIG. 22.

Further, there are cases in which the characteristic of the ferro-electric 20 deteriorates if the high-dielectric 30 directly contact the ferro-electric 20. In such a case, for example, as shown in FIG. 32, it suffices that barrier layers 32 for preventing these reactions are disposed between the ferro-electrics 20 and the high-dielectrics 30.

Next, patterning of the bottom electrode 19 is carried out.

Here, with respect to the patterning of the bottom electrode 19, in the same way as in the patterning of the ferro-electric 20 and top electrode 21, any one of a method in which a photo mask itself is used as a mask material, and a method in which a pattern of a photo mask is transferred to a hard mask, and the hard mask is used as a mask material, can be applied.

Here, an example of the latter case in which a hard mask is used, will be described.

Note that, as a hard mask, an insulating layer such as $SiO_2$ or the like may be separately used. However, in order to simplify the process, in the present embodiment, an example of the case in which the high-dielectric 30 itself is used as a hard mask will be described.

First, as shown in FIG. 26, the photo mask (resist pattern) 33 is formed by carrying out PEP (Photo Engraving Process). The high-dielectric 30 is etched by RIE by using the photo mask 33 as a mask, and the pattern of the photo mask 33 is transferred to the high-dielectric 30. As a result, the pattern of the high-dielectric 30 is completed, and a hard mask formed from the high-dielectric 30 is formed. Thereafter, the photo mask 33 is removed by ashing.

Figure 27:
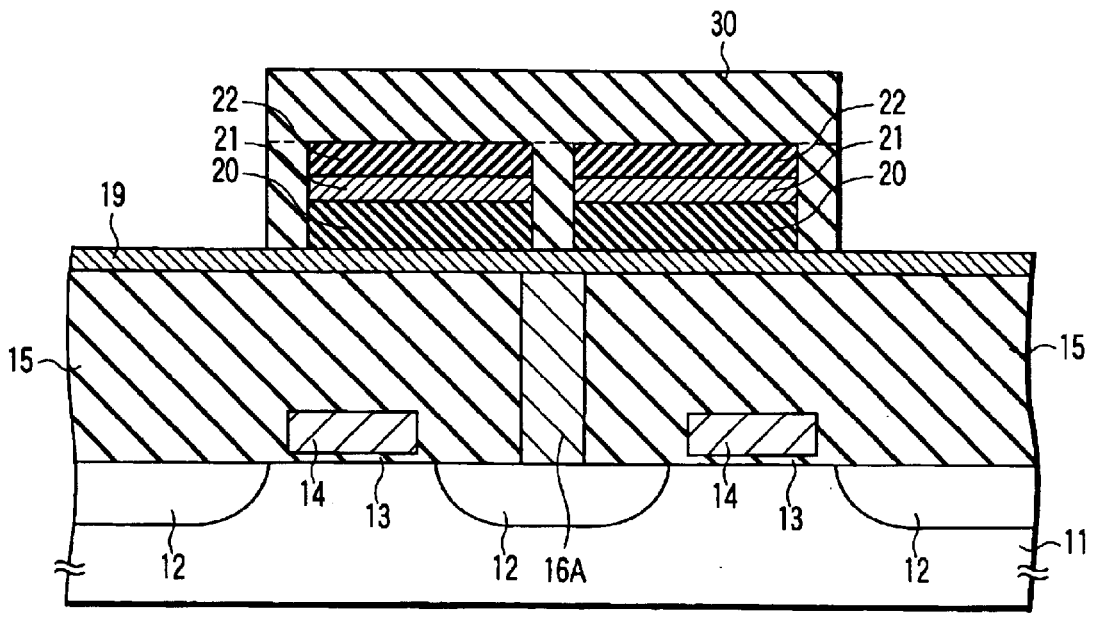
FIG. 27 is a diagram showing one process of the memory cell manufacturing method according to the example of the present invention.

Next, as shown in FIG. 27, the bottom electrode 19 is etched by carrying out RIE by using the hard mask formed from the high-dielectric 30 as a mask. As a result, the pattern of the bottom electrode 19 is completed.

Here, because the high-dielectric 30 as a hard mask is etched to some extent by RIE, the thickness of the high-dielectric 30 is made thinner in the state after the RIE than in the state before the RIE.

By using this phenomenon, for example, provided that the top surface of the high-dielectric 30 and the top surface of the insulating layer 22 are made to be substantially the same heights after the RIE, or the top surface of the high-dielectric 30 is made lower than the top surface of the insulating layer 22, it is easier to form the contact hole with respect to the top electrode 21.

Figure 28:
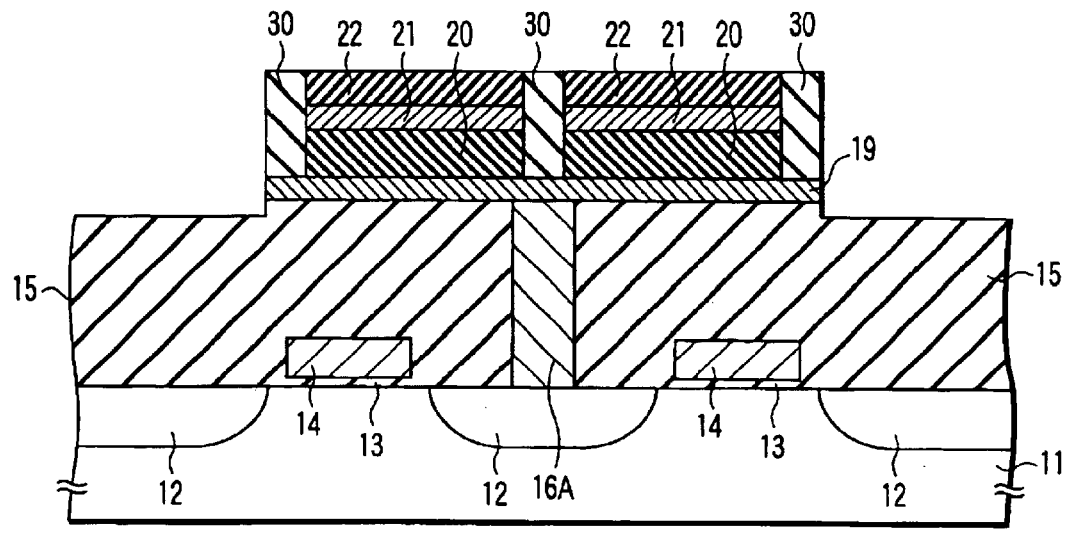
FIG. 28 is a diagram showing one process of the memory cell manufacturing method according to the example of the present invention.

Note that, as shown in FIG. 28, after patterning of the bottom electrode 19 is completed, the insulating layer (for example, silicon oxide) 15 which will be the front-end is etched to some extent by over-etching.

Figure 29:
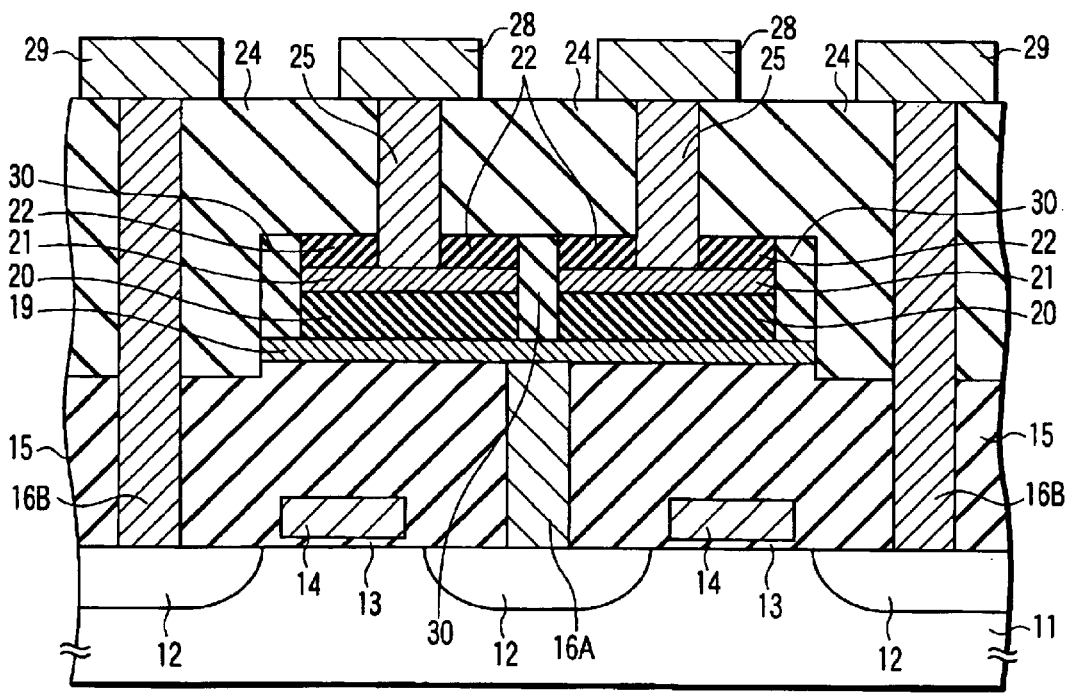
FIG. 29 is a diagram showing one process of the memory cell manufacturing method according to the example of the present invention.

Next, as shown in FIG. 29, for example, by an LPCVD method, the insulating layer (for example, silicon oxide) 24 is formed on the cell capacitor. Further, the surface of the insulting layer 24 is flattened by carrying out CMP.

Thereafter, the contact holes are formed by PEP and RIE. Here, with respect to the contact holes for the contact plugs 16B and 25, for example, it suffices to carry out etching on the insulating layers 15, 22, 24 which are formed from the same material.

Namely, with respect to all of these contact holes, it suffices to etch the insulating layers (for example, silicon oxides) 15, 22, and 24, and because there is no need to etch the high-dielectric 30, the etching process can be simplified.

Finally, the contact plugs 16B and 25 are filled into the contact holes, and moreover, when the wirings 28 and 29 are formed on the contact plugs 16B, and 25, the FeRAM memory cell shown in FIG. 22 is completed.

(3) Other Embodiments

With respect to the manufacturing methods in the respective embodiments described above, an accumulating method for an inter-capacitor dielectric and an interlayer insulating layer is not particularly limited, and for example, an accumulating method can be selected among various methods such as a spattering method, a CVD method, a CSD method (including a sol-gel method), or the like.

The capacitor according to the example of the invention is particularly effective in semiconductor memories using a capacitor as a data storage element.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor device comprising:
   a capacitor configured by a bottom electrode, a top electrode, and a dielectric disposed between the bottom electrode and the top electrode;
   an insulating layer which surrounds the capacitor;
   a high-dielectric which is disposed between the dielectric and the insulating layer, and which entirely covers side wall portions of the dielectric, and
   a barrier layer disposed between the high-dielectric and the dielectric to prevent reaction of the high-dielectric and the dielectric,
   wherein a dielectric constant of the high-dielectric is higher than a dielectric constant of the insulating layer.

2. The semiconductor device according to claim 1, wherein the dielectric constant of the high-dielectric is higher than a dielectric constant of the dielectric configuring the capacitor.

3. The semiconductor device according to claim 1, wherein a thickness of the high-dielectric in a direction perpendicular to side surfaces of the dielectric configuring the capacitor is equal to a distance from the bottom electrode to the top electrode.

4. The semiconductor device according to claim 1, wherein the insulating layer is silicon oxide.

5. The semiconductor device according to claim 1, wherein the high-dielectric is configured by any one of SiN, $TaO_2$, $TiO_2$, $Al_2O_3$, $ZrO_2$, $HfO_2$, BST, PZT, and SBT.

6. The semiconductor device according to claim 1, wherein the high-dielectric covers the bottom electrode and the top electrode.

7. The semiconductor device according to claim 1, wherein the high-dielectric covers only side wall portions of the dielectric.

8. A semiconductor device comprising:
a first capacitor and a second capacitor each of which is configured by a bottom electrode, a top electrode, and a dielectric disposed between the bottom electrode and the top electrode;
an insulating layer which surrounds the first capacitor and the second capacitor;
a high-dielectric which are disposed between the dielectric and the insulating layer, and which entirely covers side wall portions of the dielectric; and
a barrier layer disposed between the high-dielectric and the dielectric to prevent reaction of the high-dielectric and the dielectric,
wherein a dielectric constant of the high-dielectric is higher than a dielectric constant of the insulating layer.

9. The semiconductor device according to claim 8, wherein the insulating layer and the high-dielectric exist at a space between the first capacitor and the second capacitor.

10. The semiconductor device according to claim 8, wherein only the high-dielectric exists at a space between the first capacitor and the second capacitor.

11. A semiconductor device comprising:
a capacitor configured by a bottom electrode, a top electrode, and a dielectric disposed between the bottom electrode and the top electrode;
a transistor which is connected to the bottom electrode;
an insulating layer which surrounds the capacitor;
a high-dielectric which is disposed between the dielectric and the insulating layer, and which entirely covers side wall portions of the dielectric,
a barrier layer disposed between the high-dielectric and the dielectric to prevent reaction of the high-dielectric and the dielectric,
wherein a dielectric constant of the high-dielectric is higher than a dielectric constant of the insulating layer.

\* \* \* \* \*